US012585050B2

(12) United States Patent
Xu et al.

(10) Patent No.: US 12,585,050 B2
(45) Date of Patent: Mar. 24, 2026

(54) DISPLAY SUBSTRATE, DISPLAY PANEL AND DISPLAY APPARATUS

(71) Applicants:Fuzhou BOE Optoelectronics Technology Co., Ltd., Fujian (CN); BOE Technology Group Co., Ltd., Beijing (CN)

(72) Inventors: Xu Xu, Beijing (CN); Wenchao Wang, Beijing (CN); Tianfeng Zhang, Beijing (CN); Shanshan Xu, Beijing (CN); Sangjin Park, Beijing (CN); Baoqiang Wang, Beijing (CN)

(73) Assignees: Fuzhou BOE Optoelectronics Technology Co., Ltd., Fuzhou (CN); BOE Technology Group Co., Ltd., Beijing (CN)

( * ) Notice: Subject to any disclaimer, the term of this patent is extended or adjusted under 35 U.S.C. 154(b) by 432 days.

(21) Appl. No.: 18/247,425

(22) PCT Filed: May 27, 2022

(86) PCT No.: PCT/CN2022/095704
§ 371 (c)(1),
(2) Date: Mar. 30, 2023

(87) PCT Pub. No.: WO2023/123857
PCT Pub. Date: Jul. 6, 2023

(65) Prior Publication Data
US 2024/0369884 A1     Nov. 7, 2024

(51) Int. Cl.
*H10D 86/60*     (2025.01)
*G02B 5/02*     (2006.01)
(Continued)

(52) U.S. Cl.
CPC ......... *G02B 5/0294* (2013.01); *G02B 5/0242* (2013.01); *G02B 30/27* (2020.01);
(Continued)

(58) Field of Classification Search
CPC ............................. H10D 86/441; H10D 86/60
See application file for complete search history.

(56) References Cited

U.S. PATENT DOCUMENTS

2010/0066933 A1     3/2010  Oh et al.
2013/0250408 A1     9/2013  Wu et al.
(Continued)

FOREIGN PATENT DOCUMENTS

CN     101802699 A     8/2010
CN     102707448 A     10/2012
(Continued)

OTHER PUBLICATIONS

Office Action received for Chinese Patent Application No. 202280001478.9, mailed on Sep. 10, 2024, 13 pages (5 pages of English Translation and 8 pages of Original Document).
(Continued)

*Primary Examiner* — Samuel A Gebremariam
(74) *Attorney, Agent, or Firm* — ArentFox Schiff LLP; Michael Fainberg

(57)     ABSTRACT

A display substrate, a display panel and a display apparatus are provided. The display substrate includes: a base substrate; signal lines disposed at a side of the base substrate and arranged in a first direction, and an orthographic projection of each signal line on the base substrate is in a shape of a bent line; and a plurality of common electrode strips, where the plurality of common electrode strips and the signal lines are disposed at the same side of the base substrate and are insulated from each other. Each common electrode strip includes a plurality of common electrode
(Continued)

blocks arranged in sequence in the first direction, a first slit is provided between adjacent common electrode blocks, and orthographic projections of at least part of the signal lines on the base substrate are located within orthographic projections of the first slits on the base substrate.

24 Claims, 47 Drawing Sheets

(51) Int. Cl.

| | | |
|---|---|---|
| *G02B 30/27* | (2020.01) | |
| *G02F 1/1335* | (2006.01) | |
| *G02F 1/1343* | (2006.01) | |
| *G02F 1/1362* | (2006.01) | |
| *H10D 86/40* | (2025.01) | |

(52) U.S. Cl.

CPC .. *G02F 1/133512* (2013.01); *G02F 1/134318* (2021.01); *G02F 1/134345* (2021.01); *G02F 1/136286* (2013.01); *H10D 86/441* (2025.01); *H10D 86/60* (2025.01)

(56) References Cited

U.S. PATENT DOCUMENTS

| | | | |
|---|---|---|---|
| 2014/0036047 A1 | 2/2014 | Watanabe et al. |
| 2014/0098308 A1 | 4/2014 | Wu et al. |
| 2014/0293189 A1 | 10/2014 | Fukanaga et al. |
| 2017/0160604 A1 | 6/2017 | Wang |
| 2019/0243196 A1 | 8/2019 | Wang et al. |
| 2020/0271997 A1 | 8/2020 | Nakagawa |
| 2021/0333658 A1 | 10/2021 | Long et al. |
| 2023/0089004 A1 | 3/2023 | Liu et al. |

FOREIGN PATENT DOCUMENTS

| | | | |
|---|---|---|---|
| CN | 102902003 | A | 1/2013 |
| CN | 103185993 | A | 7/2013 |
| CN | 103268044 | A | 8/2013 |
| CN | 104714345 | A | 6/2015 |
| CN | 105974686 | A | 9/2016 |
| CN | 103492929 | B | 4/2017 |
| CN | 107065369 | A | 8/2017 |
| CN | 108415201 | A1 | 8/2018 |
| CN | 207780441 | U | 8/2018 |
| CN | 109581728 | A | 4/2019 |
| CN | 209132453 | U | 7/2019 |
| CN | 110646976 | A | 1/2020 |
| CN | 214474347 | U | 10/2021 |
| CN | 113805375 | A | 12/2021 |
| JP | 2003057673 | A | 2/2003 |
| JP | 2006276687 | A | 10/2006 |
| JP | 2010211027 | A | 9/2010 |
| KR | 10-2011-0066491 | A | 6/2011 |
| WO | 2021035636 | A1 | 3/2021 |

OTHER PUBLICATIONS

Chinese Office Action for 202180004317.0 issued on Dec. 23, 2025.

01

02

04

03

05

42(421)
42(422)
41
43

Y

X

2(22)     2(21)     2(22)

202

201

Y

X

21(201)

62
61
31
1

42(421)
42(422)
41

43

Y

X

Light
leakage
22.9

71

71

71

DISPLAY SUBSTRATE, DISPLAY PANEL AND DISPLAY APPARATUS

CROSS REFERENCE TO RELATED APPLICATIONS

The application is a US National Stage of International Application No. PCT/CN2022/095704, filed on May 27, 2022, which claims the priority to International Application No. PCT/CN2021/142652, filed on Dec. 29, 2021 and entitled "display apparatus", which is incorporated herein in its entirety by reference.

FIELD

The disclosure relates to the field of semiconductor technology, in particular to a display substrate, a display panel and a display.

BACKGROUND

As three-dimensional (3D) display has developed rapidly in recent years, a grating 3D display apparatus has come under the spotlight on account of its simple process, small crosstalk and other advantages. It usually includes a display panel and a grating, and displays on the display panel left and right views through the grating, then the user will see a 3D image.

SUMMARY

The disclosure provides a display substrate, a display panel and a display apparatus.

The display substrate includes: a base substrate; a plurality of signal lines, where the plurality of signal lines are disposed at a side of the base substrate and are arranged in a first direction, and an orthographic projection of each signal line on the base substrate is in a shape of a bent line; and a plurality of common electrode strips. The plurality of common electrode strips and the signal lines are disposed at the same side of the base substrate and are insulated from each other, the plurality of common electrode strips extend in the first direction and are arranged in a second direction, each common electrode strip includes a plurality of common electrode blocks arranged in sequence in the first direction, a first slit is provided between adjacent common electrode blocks, and orthographic projections of at least part of the signal lines on the base substrate are located within orthographic projections of the first slits on the base substrate.

In some embodiments, the signal line includes a first signal line portion and a second signal line portion, an orthographic projection of the first signal line portion on the base substrate is located within a region of the orthographic projection of the first slit on the base substrate, and an orthographic projection of the second signal line portion on the base substrate is positioned in a gap region between two adjacent common electrode strips. The orthographic projection of the first signal line portion on the base substrate is in a shape of a bent line, and the orthographic projection of the first slit on the base substrate and the orthographic projection of the first signal line portion on the base substrate are similar in shape.

In some embodiments, the first slit has a width greater than a width of the first signal line portion in in a direction perpendicular to an extension direction of the first signal line portion.

In some embodiments, the display substrate further includes a data line layer disposed on a side of the common electrode strip facing away from the base substrate, where the data line layer includes a plurality of data lines extending in the second direction. The signal lines include the data lines.

In some embodiments, the data line layer further includes a plurality of first connection lines extending in the second direction, and the two adjacent common electrode strips are electrically connected with each other through the first connection line. The signal lines further include the first connection lines.

In some embodiments, the common electrode strip is provided with the first slit only in a region corresponding to the data line.

In some embodiments, the common electrode strip is provided with the first slits in a region corresponding to the data line and a region corresponding to the first connection line.

In some embodiments, the data lines and the first connection lines are alternately arranged in the first direction.

In some embodiments, the display substrate further includes a plurality of second connection lines extending in the first direction, where the common electrode blocks of the same common electrode strip are electrically connected with the same second connection line.

In some embodiments, the display substrate further includes a gate layer between a common electrode layer and the data line layer, where the gate layer includes a plurality of gate lines extending in the second direction, and the second connection lines are disposed in the gate layer.

In some embodiments, the display substrate further includes a shade strip disposed on a side of the common electrode strip facing away from the base substrate, where an orthographic projection of the shade strip on the base substrate covers a region of the common electrode block close to the first slit.

In some embodiments, the orthographic projection of the shade strip on the base substrate and the orthographic projection of the first slit on the base substrate do not overlap each other.

In some embodiments, the orthographic projection of the shade strip on the base substrate and the orthographic projection of the first slit on the base substrate are similar in shape.

In some embodiments, in the second direction, the shade strip has a length approximately the same as a length of the first signal line portion.

In some embodiments, the shade strip is disposed in the gate layer.

In some embodiments, the display substrate further includes a plurality of pixel electrodes disposed on a side of the data line layer facing away from the base substrate. The pixel electrode includes two sub-pixel electrode portions arranged in the first direction and a bridge portion connecting the two sub-pixel electrode portions, and a second slit is provided between the two sub-pixel electrode portions.

In some embodiments, the orthographic projection of the signal line on the base substrate is located within an orthographic projection of the second slit on the base substrate.

In some embodiments, the orthographic projection of the first slit on the base substrate is located within the orthographic projection of the second slit on the base substrate.

In some embodiments, the sub-pixel electrode portion includes a skeleton portion and a plurality of branch groups, the skeleton portion is in a shape of a bent line with a body extending in the second direction, the plurality of branch groups extend from the skeleton portion to a side facing away from the second slit, and outer edges of adjacent branch groups connected with the same skeleton protrude alternatively.

In some embodiments, the plurality of branch groups include first branch groups and second branch groups, and in the plurality of branch groups connected with the same skeleton portion, the first branch groups and the second branch groups are alternately arranged.

In some embodiments, sizes of protrusions of the first branch groups relative to the second branch groups are approximately the same.

In some embodiments, the size of the protrusions of the first branch groups relative to the second branch groups are 2-5 times as large as a spacing between adjacent pixel electrodes.

In some embodiments, the numbers of the first branch group and the second branch group connected with the same skeleton portion are approximately the same.

In some embodiments, first branch groups of different sub-pixel electrode portions in the same pixel electrode are staggered in a direction parallel to an extension direction of the first branch groups, and second branch groups of different sub-pixel electrode portions in the same pixel electrode are staggered in the direction parallel to an extension direction of the first branch groups.

In some embodiments, the branch group includes: a plurality of branches extending from the skeleton portion to a side facing away from the second slit, and a third slit is provided between adjacent branches in the same branch group; and outer edges, facing away from the second slit, of the plurality of branches in the same branch group are approximately flush.

In some embodiments, outer edges of branches of the first branch groups in the same sub-pixel electrode portion are all flush, and outer edges of branches of the second branch groups in the same sub-pixel electrode portion are all approximately flush.

In some embodiments, the number of branches contained in at least part of the first branch groups is approximately the same as the number of branches contained in at least part of the second branch groups.

In some embodiments, patterns of outer edge of branch groups of the adjacent pixel electrodes are complementary to each other.

In some embodiments, the first branch group of the pixel electrode faces a second branch group of an adjacent pixel electrode adjacent to the pixel electrode.

In some embodiments, the first connection line has a line width less than a line width of the data line, and a spacing between the first connection line and the second slit is less than a spacing between the data line and the second slit.

In some embodiments, the data line layer further includes a first electrode electrically connected with the data line and a second electrode separated from the first electrode; and the pixel electrode includes a first type of pixel electrode and a second type of pixel electrode alternately arranged in the first direction. The first type of pixel electrode includes a first adaptation portion and a first connection portion, the first connection portion crosses the first connection line to connect the first adaptation portion to one sub-pixel electrode portion in the first type of pixel electrode, and an orthographic projection of the first adaptation portion on the base substrate and an orthographic projection of the second electrode on the base substrate have an overlapped region; and the second type of pixel electrode includes a second adaptation portion directly connected with one sub-pixel electrode portion in the second type of pixel electrode, and an orthographic projection of the second adaptation portion on the base substrate and the orthographic projection of the second electrode on the base substrate have an overlapped region.

In some embodiments, the second type of pixel electrode further includes: a compensation portion extending from a side of the second adaptation portion in the first direction facing away from the data line, and an orthographic projection of the compensation portion on the base substrate overlaps an orthographic projection of the first connection line on the base substrate.

In some embodiments, an overlapped area formed by the orthographic projection of the compensation portion on the base substrate and the orthographic projection of the first connection line on the base substrate is approximately the same as an overlapped area formed by an orthographic projection of the first connection portion on the base substrate and the orthographic projection of the first connection line on the base substrate.

In some embodiments, the orthographic projection of the compensation portion on the base substrate and the orthographic projection of the first connection portion on the base substrate are similar in shape.

In some embodiments, the compensation portion and the second adaptation portion are in the same layer.

In some embodiments, the sub-pixel electrode portion, the bridge portion, the first adaptation portion and the first connection portion of the same pixel electrode are in the same layer.

An embodiment of the disclosure provides a display panel including the display substrate according to the embodiments of the disclosure.

In some embodiments, the display panel further includes an opposite substrate arranged opposite to the display substrate. The opposite substrate includes a black matrix, the black matrix includes a first black matrix portion arranged corresponding to a first slit region, and an orthographic projection of the first black matrix portion on a base substrate covers an orthographic projection of a first slit on the base substrate.

In some embodiments, an outer edge of the first black matrix portion is approximately flush with an outer edge of a shade strip, facing away from the first slit.

In some embodiments, the first black matrix portion is provided with a first black matrix sub-portion and second black matrix sub-portions positioned at two sides of the first black matrix sub-portion, an orthographic projection of the first black matrix sub-portion on the base substrate and the orthographic projection of the first slit on the base substrate coincide with each other, and an orthographic projection of the second black matrix sub-portion on the base substrate and an orthographic projection of the shade strip on the base substrate coincide with each other.

In some embodiments, the first black matrix sub-portion with the orthographic projection on the base substrate covering an orthographic projection of a first connection line on the base substrate has a width less than or equal to a width of the first black matrix sub-portion with the orthographic projection covering an orthographic projection of a data line on the base substrate.

The embodiment of the disclosure further provides a display apparatus including the display panel according to the embodiment of the disclosure.

DETAILED DESCRIPTION

Figure 1:
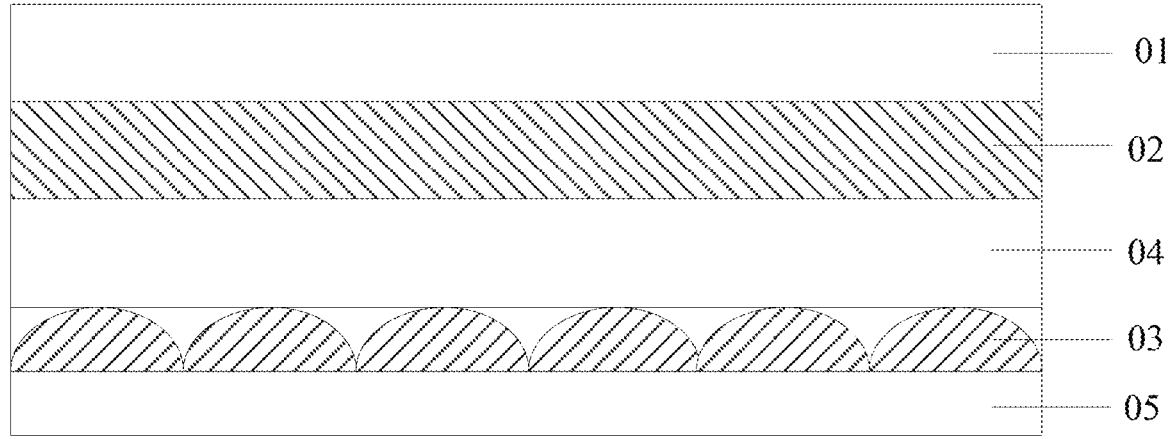
FIG. 1 is a schematic structural diagram of a three-dimensional (3D) display apparatus.

In order to make objectives, technical solutions and advantages of embodiments of the disclosure clearer, the technical solutions of the embodiments of the disclosure will be clearly and completely described with reference to accompanying drawings of the embodiments of the disclosure. Apparently, the described embodiments are some embodiments rather than all embodiments of the disclosure. All other embodiments derived by a person of ordinary skill in the art based on the described embodiments of the disclosure without creative efforts shall fall within the protection scope of the disclosure.

Unless otherwise indicated, technical terms or scientific terms used in the disclosure should have ordinary meanings understood by a person of ordinary skill in the field to which the disclosure belongs. Words such as "first" and "second" used in the disclosure do not denote any order, quantity, or importance, but are merely used to distinguish between different components. Words such as "include" or "encompass" are intended to mean that an element or item in front of the word encompasses elements or items that are present behind the word and equivalents thereof, but does not exclude other elements or items. Words such as "connection" and "connected" are not limited to physical or mechanical connections, but can include an electrical connection in a direct or indirect mode. "Up", "down", "left", "right", etc. are merely used to indicate a relative position relation, and the relative position relation can also change accordingly when an absolute position of a described object changes.

As used herein, "about" or "approximately the same" includes a stated value and means to be within an acceptable deviation range for a specific value as determined by a person of ordinary skill in the art in consideration of the measurement in question and errors (i.e., limitation of a measurement system) related to the measurement of a specific variable. For example, "approximately the same" can mean that a difference from the stated value falls within one or more standard deviation ranges, or within +/−30%, 20%, 10% and 5%.

In the accompanying drawings, thicknesses of a layer, a film, a panel, a region, etc. are enlarged for clarity. Exemplary implementation modes are described herein with reference to a cross-sectional view of a schematic diagram of an idealized implementation mode. In this way, a deviation from a shape in the figure as a result of, for example, a manufacturing technique and/or a tolerance will be expected. Therefore, implementation modes described herein should not be interpreted as being limited to a specific shape of a region as shown herein, but include the deviation in shape caused by, for example, manufacturing. For example, a region illustrated or described as being flat can typically have a rough and/or nonlinear feature. Moreover, a sharp corner shown can be circular. Therefore, the region shown in the figure is schematic in nature, and the shape thereof is not intended to illustrate an exact shape of the region, or limit the scope of the claims.

In order to keep the following description of the embodiments of the disclosure clear and concise, detailed descriptions of known functions and known components are omitted in the disclosure.

With reference to FIG. 1, a schematic structural diagram of glasses-free three dimension (3D) display apparatus is shown. A light source 01, a display panel 02, a flat glass 04, a cylindrical lens layer 03 and a protective layer 05 (for example, a resin layer) that are sequentially arranged are included, where the display panel 02 receives an external signal and displays a two-dimensional image, and parallax is achieved through refraction by the cylindrical lens layer 03 in the front of the screen, therefore forming a three-dimensional sense, and a viewer can get a 3D image.

Figure 2:
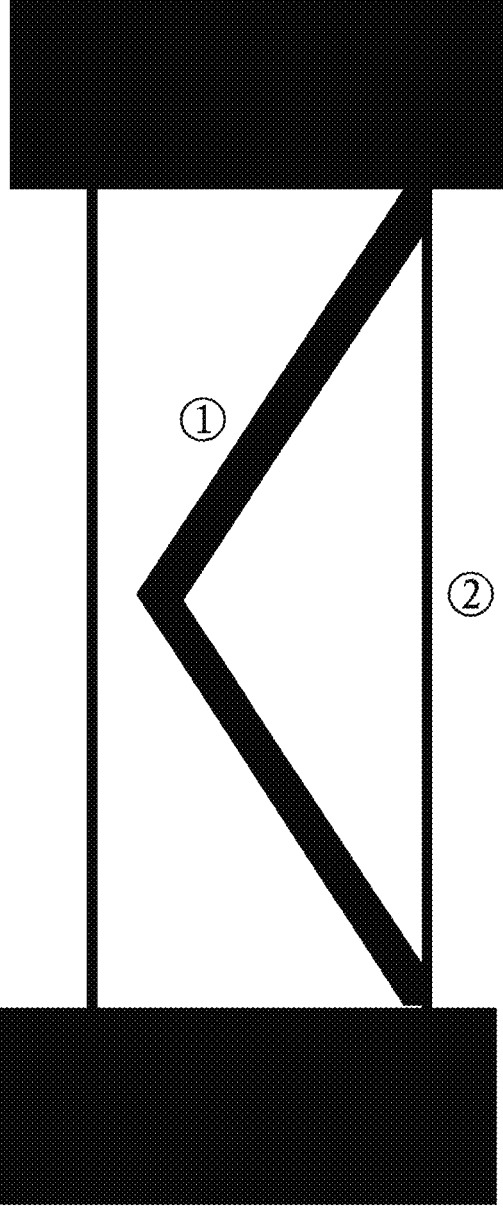
FIG. 2 is a schematic diagram of an ideal dark spot of a glasses-free 3D product.

In order to eliminate a moire pattern defect of a glasses-free 3D product, a dark spot of a pixel in a vertical direction in the display panel should be as small as possible; otherwise a wider dark spot may form a thick moire line after being imaged through a cylindrical lens grating. With reference to FIG. 2, a schematic diagram of an ideal display dark spot for a glasses-free 3D product is shown in FIG. 2. A pixel in a display panel should be designed according to two rules as below: a vertical data line at a position ① is an opaque metal line, and is required to be bent to slant a dark spot; and adjacent pixels at a position ② are not ideal for zero-spacing display, so it is necessary to reduce spacing between adjacent pixel electrodes as much as possible, reduce a width of a non-display region, improve light efficiency at an edge of the pixel, and minimize a width of a vertical dark spot.

The glasses-free 3D pixel structure designed in a high advanced super dimension switch (HADS) display mode, and provided with thick organic films (ORG) between the data line and a common electrode layer and between the data line and the pixel electrode layer, is more suitable for a small-sized product. In the case that the product has a large size, a vertical data line has a greater length, and a line width of the data line is bound to increase in order to improve a charge rate to solve the problem of charging difficulty. Both increase an overlapped area between a data signal and an upper common (Com) electrode and an overlapped area between the data signal and an upper pixel electrode, and greatly increase coupling capacitance. Even if an organic film process is used, the above problem may not be solved, resulting in that a large-size product may not be made into the HADS mode. Therefore, mass production through the above HADS ORG process is limited to the small-sized product, and the organic film has a great impact on productivity, and is not conducive to the mass production application of 3D due to high cost.

Figure 3A:
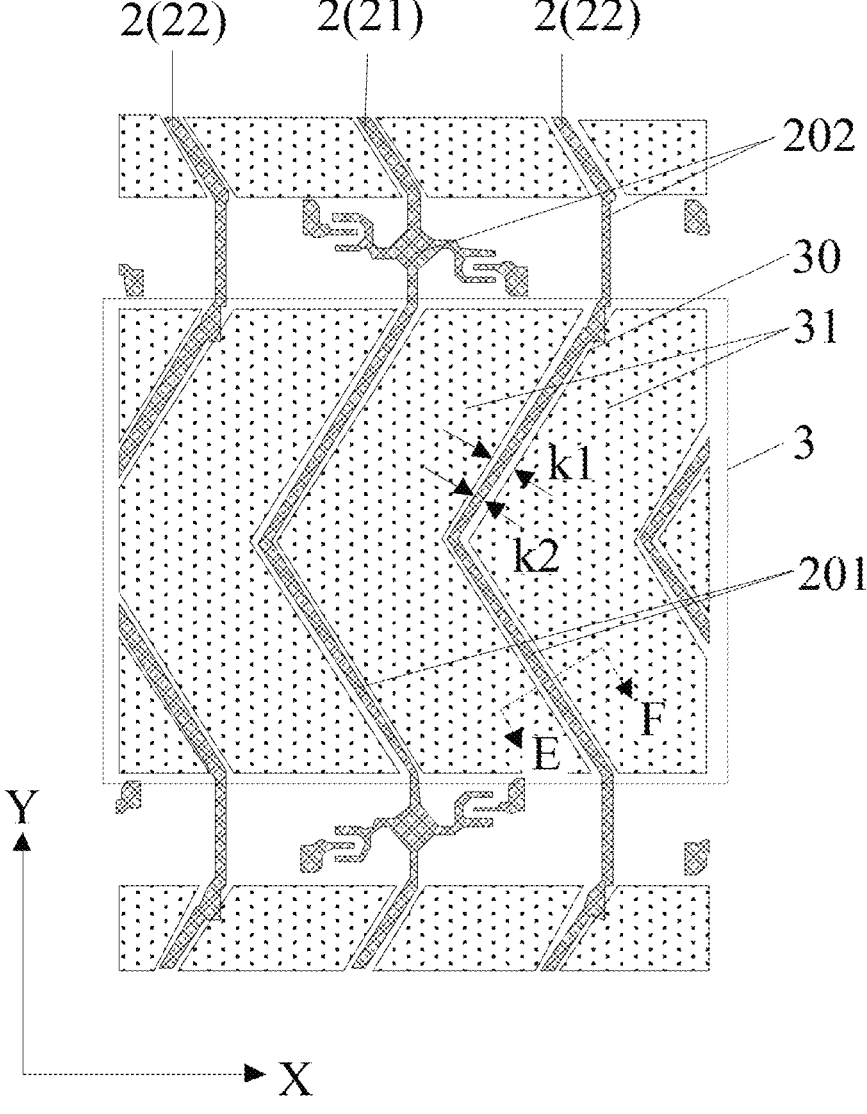
FIG. 3A is a schematic diagram of a display substrate according to an embodiment of the disclosure.
Figure 3B:
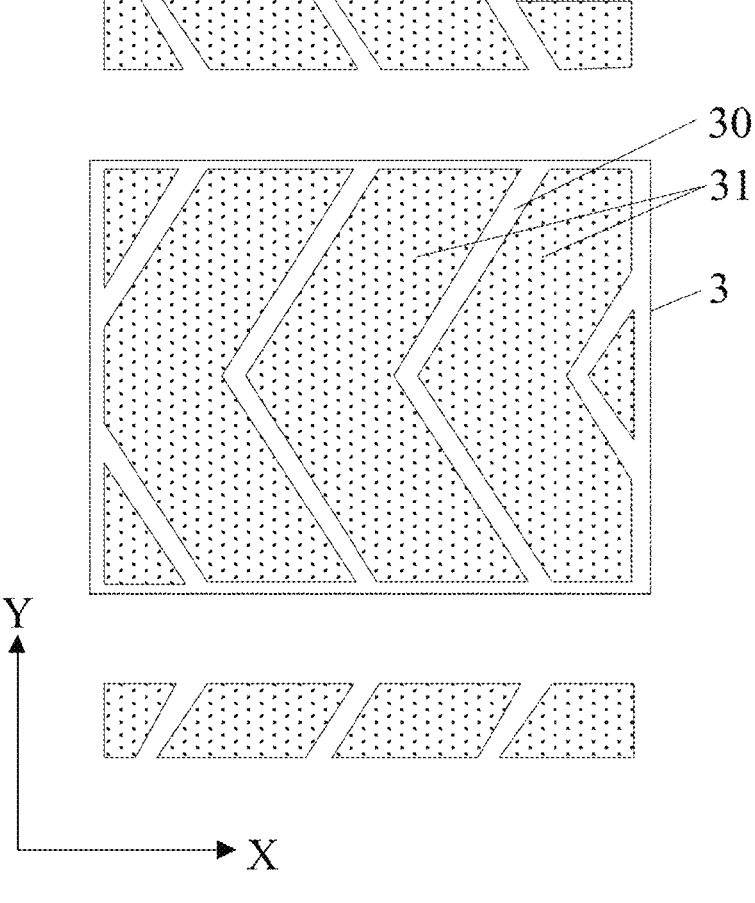
FIG. 3B is a schematic diagram of a single film layer of a common electrode layer shown in FIG. 3A.
Figure 3C:
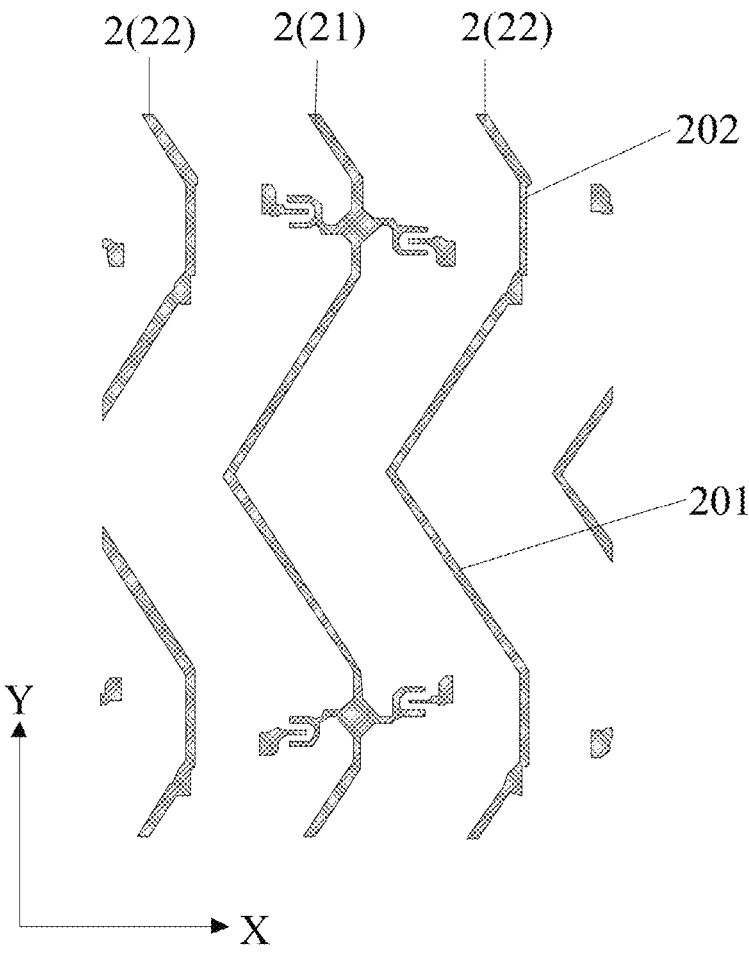
FIG. 3C is a schematic diagram of a single film layer of a signal line layer shown in FIG. 3A.
Figure 3D:
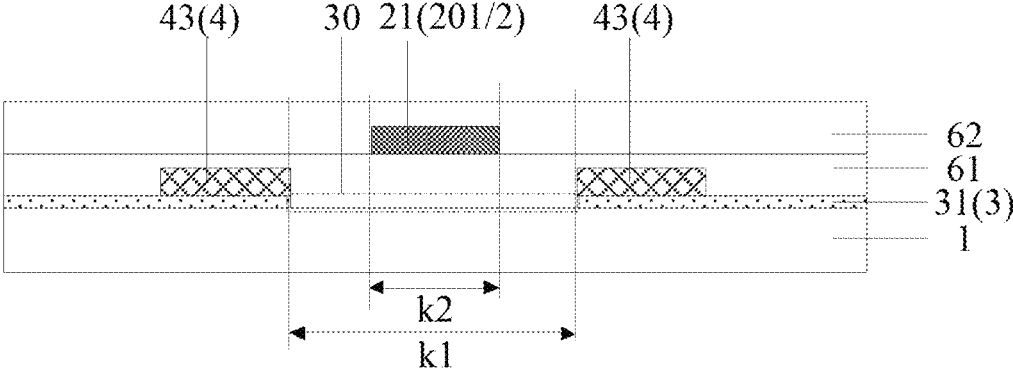
FIG. 3D is a schematic diagram of a section of the display substrate along a dotted line EF shown in FIG. 3A.
Figure 4A:
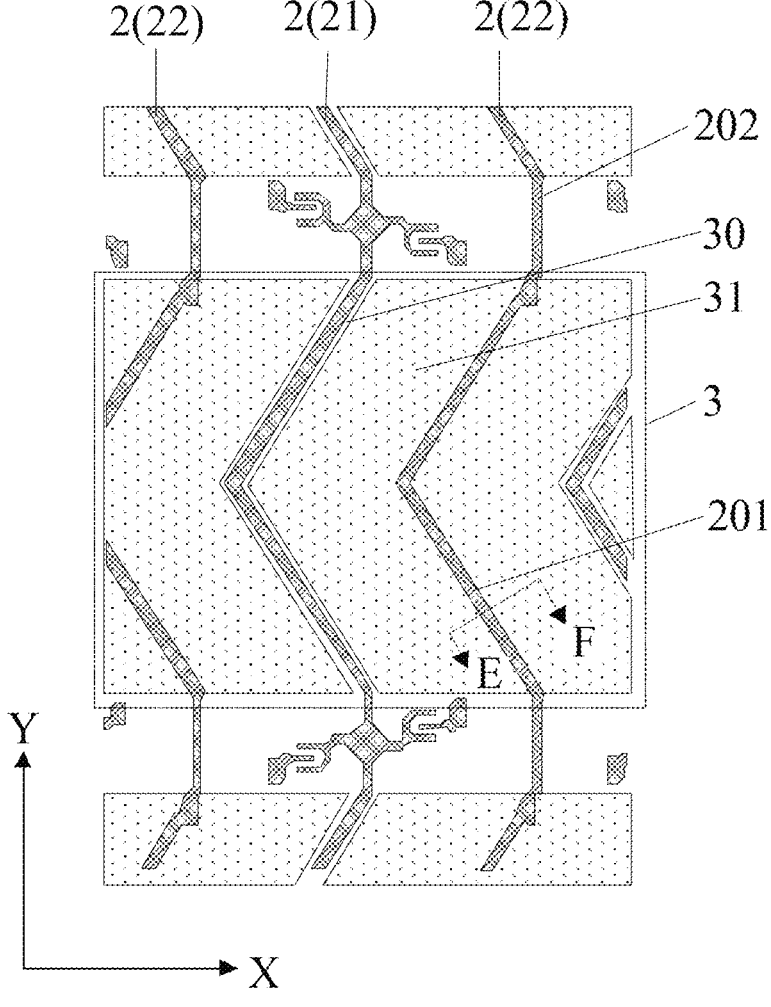
FIG. 4A is a schematic diagram of a display substrate according to an embodiment of the disclosure.
Figure 4B:
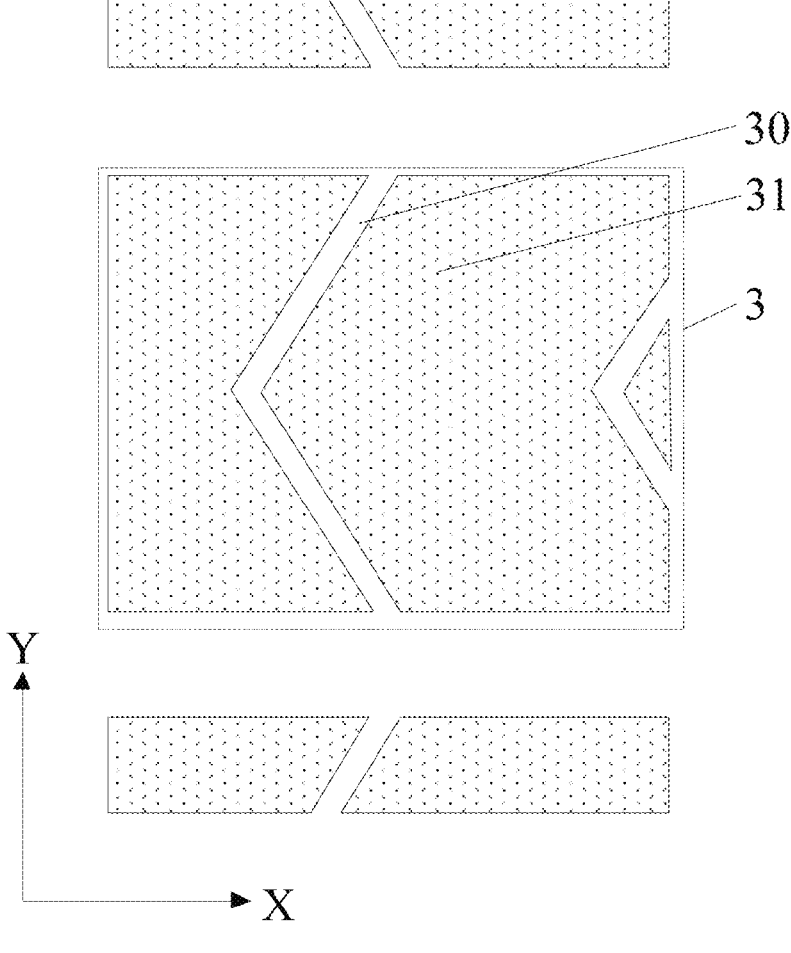
FIG. 4B is a schematic diagram of a single film layer of a common electrode layer in shown FIG. 4A.
Figure 4C:
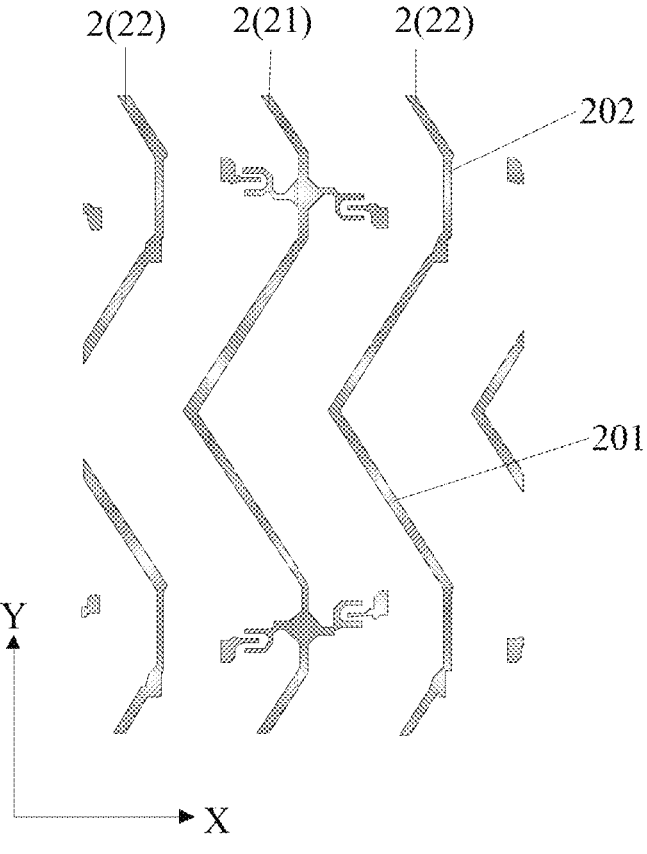
FIG. 4C is a schematic diagram of a single film layer of a signal line layer shown in FIG. 4A.
Figure 4D:
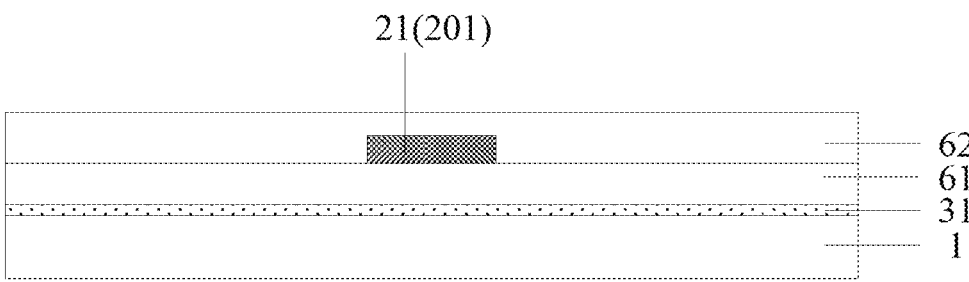
FIG. 4D is a schematic diagram of a section of the display substrate along a dotted line EF shown in FIG. 4A.

In view of this, as shown in FIGS. 3A-3D and 4A-4D, FIG. 3B is a schematic diagram of a single film layer of a common electrode layer shown in FIG. 3A, FIG. 3C is a schematic diagram of a single film layer of a signal line layer shown in FIG. 3A, FIG. 3D is a schematic diagram of a section along a dotted line EF shown in FIG. 3A, FIG. 4B is a schematic diagram of a single film layer of a common electrode layer shown in FIG. 4A, FIG. 4C is a schematic diagram of a single film layer of a signal line layer shown in FIG. 4A, and FIG. 4D is a schematic diagram of a section along a dotted line EF shown in FIG. 4A. The embodiment of the disclosure provides a display substrate. The display substrate includes:

a base substrate 1;

a plurality of signal lines 2, where the plurality of signal lines 2 are disposed at a side of the base substrate 1 and are arranged in a first direction X, a shape of an orthographic projection of each signal line on the base substrate 1 is a bent line; and specifically, a main extending direction of the signal line 2 is a second direction Y; and a plurality of common electrode strips 3, where the plurality of common electrode strips 3 and the signal lines 2 are disposed at the same side of the base substrate 1 and are insulated from each other. The plurality of common electrode strips 3 extend in the first direction X and are arranged in the second direction Y, each common electrode strip 3 includes a plurality of common electrode blocks 31 arranged in sequence in the first direction X, a first slit 30 is provided between adjacent common electrode blocks 31, and orthographic projections, on the base substrate 1, of at least part of the signal lines 2 are located within orthographic projections of the first slits 30 on the base substrate 1. Specifically, one common electrode strip 3 may correspond to one row of pixel electrodes.

In the embodiment of the disclosure, the common electrode strip 3 includes the plurality of common electrode blocks 31 arranged in sequence in the first direction X, the first slit 30 is provided between adjacent common electrode blocks 31, and the orthographic projection, on the base substrate 1, of the signal lines 2 is located within the orthographic projection of the first slit 30 on the base substrate 1. By designing the common electrode strip 3 in blocks, the common electrode blocks 31 are arranged with the bent signal line 2 as a boundary, so as to avoid a large-area vertical overlap between the common electrode strip 3 and the signal line 2, and reduce coupling capacitance between the common electrode strip 3 and the signal line 2.

Moreover, compared with the related art in which coupling capacitance between a common electrode strip 3 and a signal line 2 is reduced by arranging a thick organic film, the coupling capacitance may be reduced without arranging an organic film according to the embodiment of the disclosure, such that applicability to a large-size display product and low manufacturing cost are achieved, and mass production and application of 3D display products may be facilitated.

In some embodiments, as shown in FIGS. 3A-3D and 4A-4D, the signal line 2 includes a first signal line portion 201 and a second signal line portion 202; an orthographic projection of the first signal line portion 201 on the base substrate 1 is located within a region of the orthographic projection of the first slit 30 on the base substrate 1, and an orthographic projection of the second signal line portion 202 on the base substrate 1 is located in a gap between two adjacent common electrode strips 3. The orthographic projection of the first signal line portion 201 on the base substrate 1 is in a shape of a bent line, and the orthographic projection of the first slit 30 on the base substrate 1 and the orthographic projection of the first signal line portion 201 on the base substrate 1 are similar in shape. In this way, the first signal line portion 201 is located in the first slit 30 between adjacent common electrode blocks 31, and a vertical overlap between the common electrode strip 3 and the signal line 2 is avoided. Moreover, the orthographic projection of the first signal line portion 201 on the base substrate 1 is in the shape of a bent line, such that a dark spot may be slanted, a moire pattern in the display screen may be eliminated, and a display effect may be improved.

In some embodiments, as shown in FIGS. 3A-3D, the first slit 30 has a width k1 greater than a width k2 of the first signal line portion 201 in a direction perpendicular to an extension direction of the first signal line portion 201.

In some embodiments, as shown in FIGS. 3A-3D and FIGS. 4A-4D, the display substrate further includes a data line layer 2 disposed at a side of the common electrode strip 3 facing away from the base substrate 1, and the data line layer 2 includes a plurality of data lines 21 extending in the second direction. Here the signal line 2 includes the data line 21.

In some embodiments, as shown in FIGS. 3A-3D and FIGS. 4A-4D, the data line layer further includes a plurality of first connection lines 22 extending in the second direction Y, and the two adjacent common electrode strips 3 are electrically connected with each other through the first connection line 22. Here, the signal line 2 further includes the first connection line 22.

During specific implementation, the common electrode strip 3 may be provided with the first slit 30 in a region corresponding to each data line 2, or may be merely provided with the first slit 30 in a region corresponding to part of the signal lines 2, which will be described below with reference to specific examples.

For example, in some embodiments, as shown in FIGS. 3A-3D, the common electrode strip 3 is provided with the first slits 30 in the region corresponding to the data line 21 and the region corresponding to the first connection line 22. In the embodiment of the disclosure, the common electrode strip 3 is provided with the first slits 30 in the region corresponding to the data line 21 and the region corresponding to the first connection line 22, and the common electrode strips 3 are designed in blocks, and are arranged with the bent signal line 2 as the boundary, so as to avoid the large-area vertical overlap between the common electrode strip 3 and the signal line 2.

For example, in some embodiments, as shown in FIGS. 4A-4D, the common electrode strip 3 is merely provided with the first slit 30 in the region corresponding to the data line 21. In the embodiment of the disclosure, the common electrode strip 3 is merely provided with the first slit 30 in the region corresponding to the data line 21, that is, the common electrode strip 3 has a completely planar shape below the first connection line 22, and there is no coupling capacitance, thereby achieving an electric field shielding effect.

In some embodiments, as shown in FIGS. 3A-3D and FIGS. 4A-4D, the data lines 21 and the first connection lines 22 are alternately arranged in the first direction X.

Figure 3E:
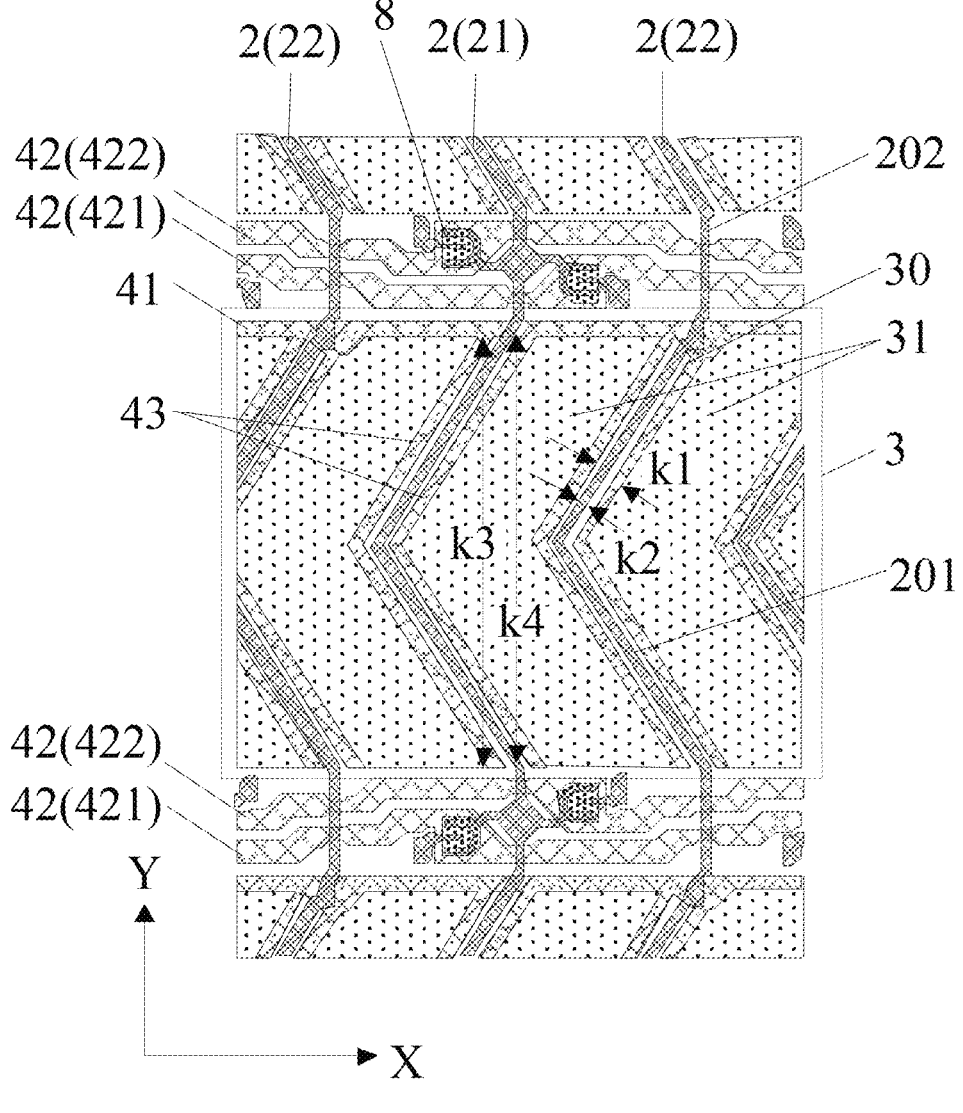
FIG. 3E is a schematic diagram of the display substrate with a stacked gate layer as compared to the display substrate shown in FIG. 3A.
Figure 3F:
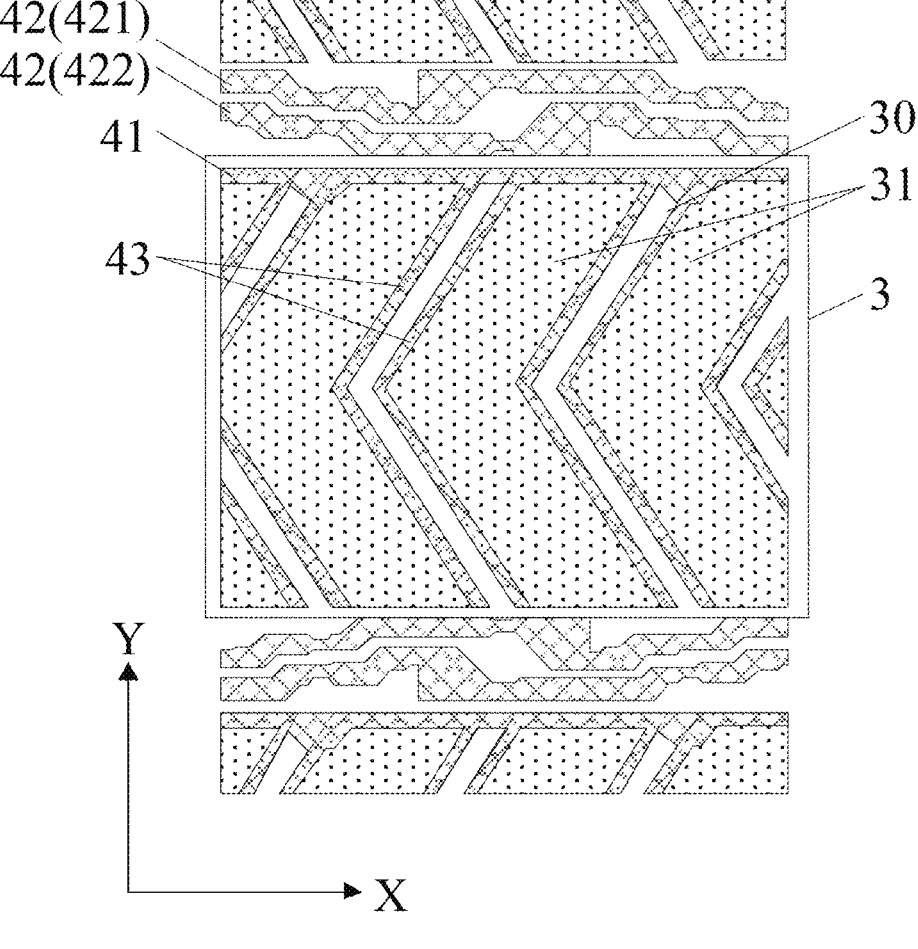
FIG. 3F is a schematic diagram of a single film layer of the gate layer shown in FIG. 3E.
Figure 3G:
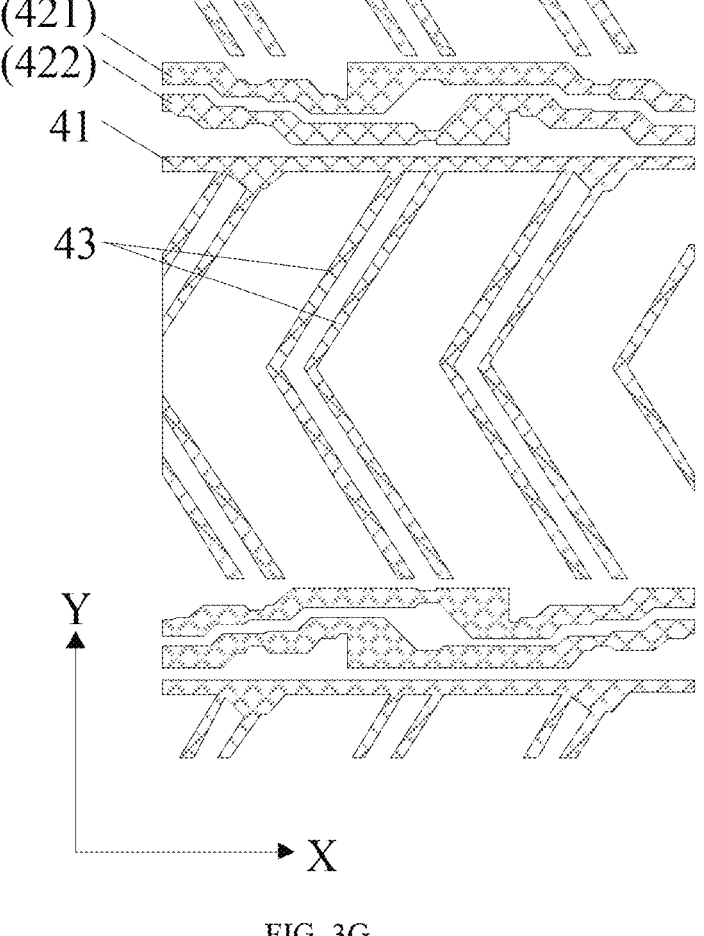
FIG. 3G is a schematic diagram of a section of the display substrate along a dotted line GH shown in FIG. 3E.
Figure 4E:
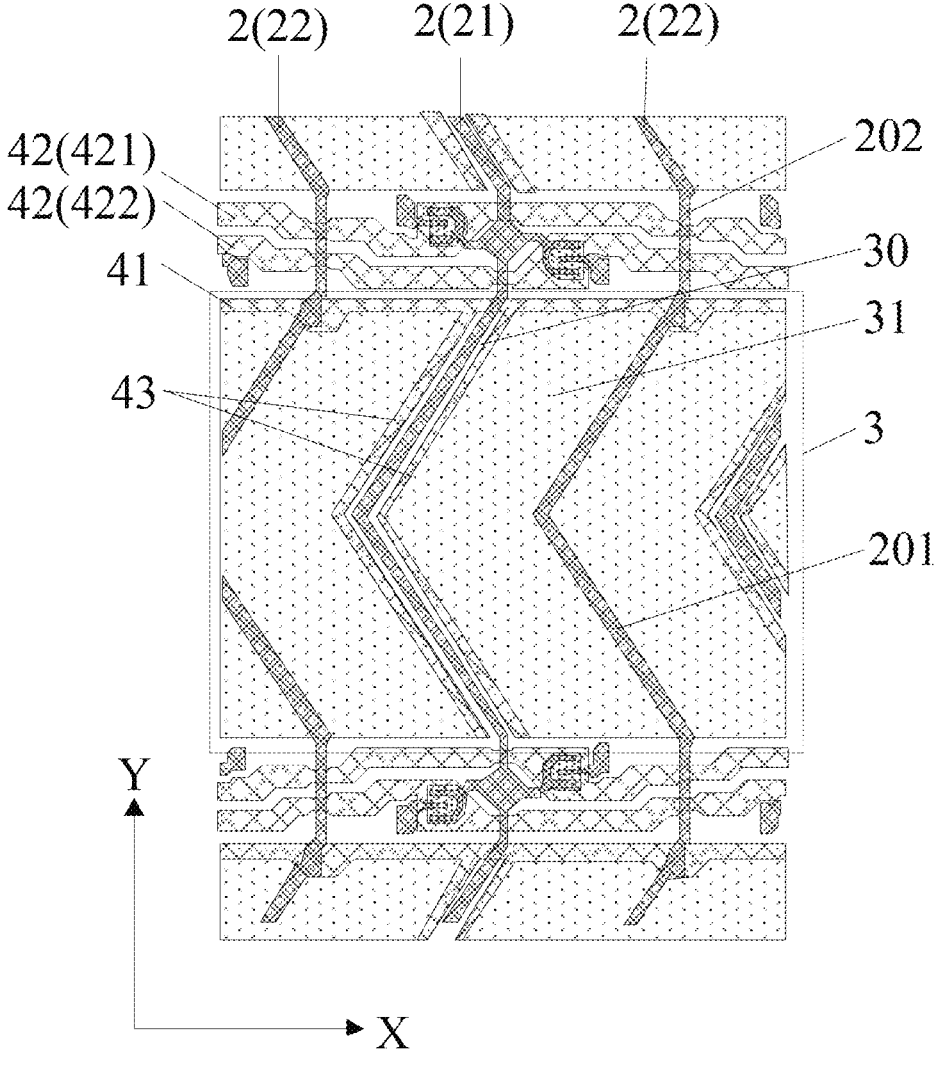
FIG. 4E is a schematic diagram of the display substrate with a stacked gate layer as compared to the display substrate shown in FIG. 4A.
Figure 4F:
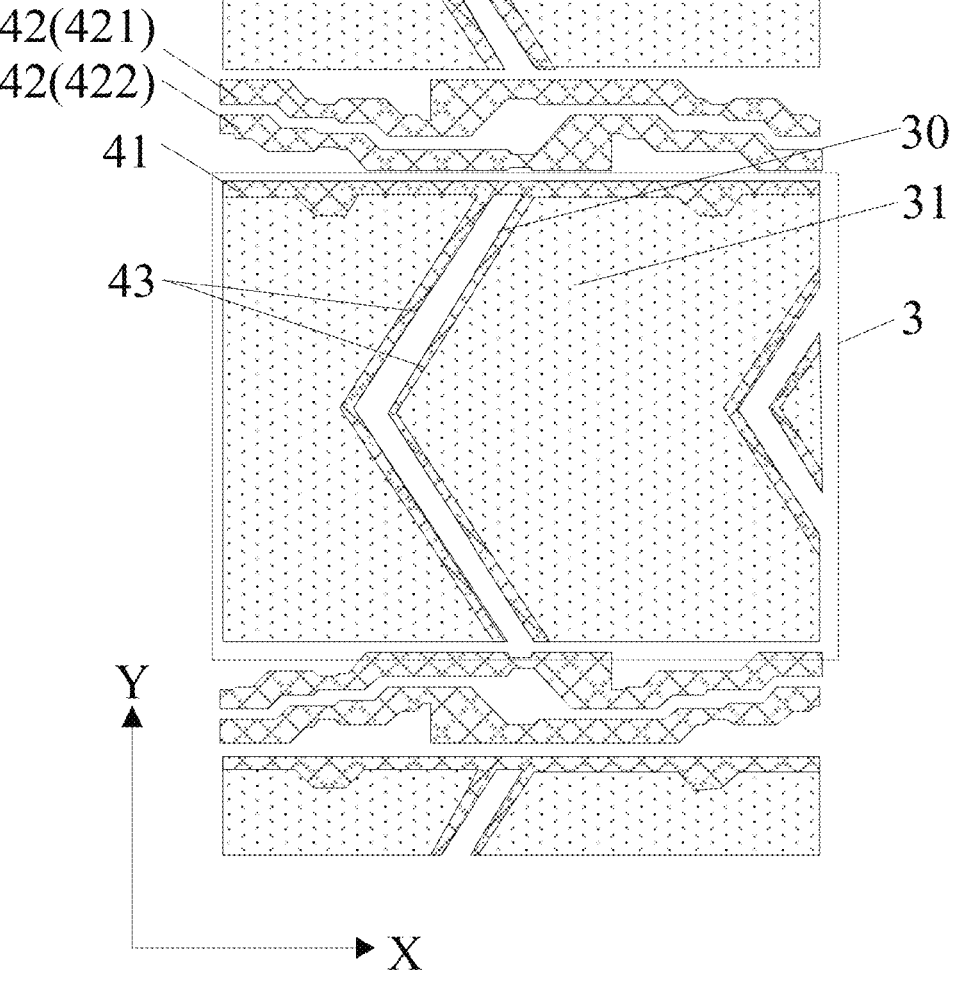
FIG. 4F is a schematic diagram of a single film layer of the gate layer shown in FIG. 4E.
Figure 4G:
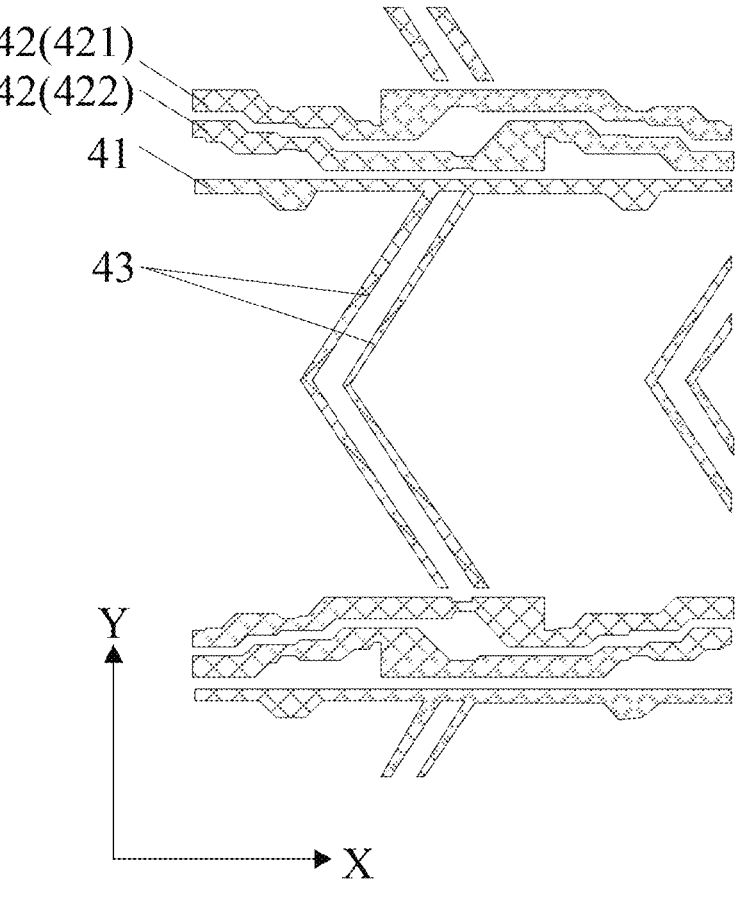
FIG. 4G is a schematic diagram of a section of the display substrate along a dotted line GH in FIG. 4E.

In some embodiments, as shown in FIGS. 3E-3G and FIGS. 4E-4G, FIG. 3F is a schematic diagram of film layers of the gate layer and a common electrode layer shown in FIG. 3E, FIG. 3G is a schematic diagram of a single film layer of the gate layer shown in FIG. 3E, FIG. 4F is a schematic diagram of film layers of the gate layer and a common electrode layer shown in FIG. 4E, and FIG. 4G is a schematic diagram of a single film layer of the gate layer shown in FIG. 4E. The display substrate further includes: a plurality of second connection lines 41 extending in the first direction X, and the common electrode blocks 31 of the same common electrode strip 3 may be electrically connected with the same second connection line 41.

In some embodiments, as shown in FIGS. 3E-3G and FIGS. 4E-4G, the display substrate further includes a gate layer 4 between a common electrode layer and the data line layer 2, and the gate layer 4 includes a plurality of gate lines 42 extending in the second direction Y; and the second connection line 41 is disposed in the gate layer 4.

Specifically, as shown in FIGS. 3D and 4D, a first insulation layer 61 may be disposed between the common electrode strip 3 and the data line layer 2, and a second insulation layer 62 may be provided at a side of the data line layer 2 facing away from the first insulation layer 61. As shown in FIGS. 3E-3G and FIGS. 4E-4G, the common electrode blocks 31 of the same common electrode strip 3 are electrically connected with the same second connection line 41. Specifically, the second connection line 41 and the common electrode strip 3 may be disposed in adjacent layers, and the second connection line 41 and the common electrode strip 3 may be electrically connected with each other through direct contact. The first connection line 22 and the common electrode strip 3 may be positioned in different layers, and the first connection line 22 may be electrically connected with the second connection line 41 specifically through a via hole running through the first insulation layer 61, so as to be further electrically connected with the common electrode strip 3.

Figure 5A:
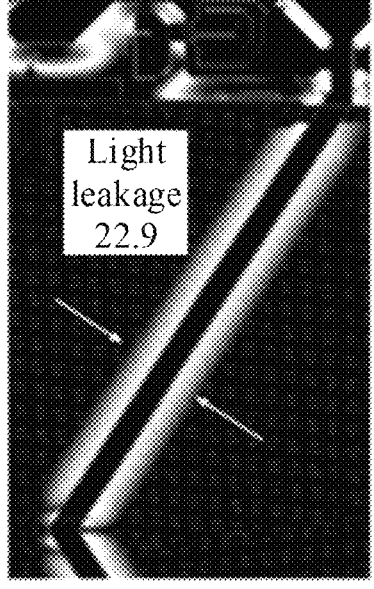
FIG. 5A is a schematic diagram for illustrating light leakage testing of a display product without a shade strip.
Figure 5B:
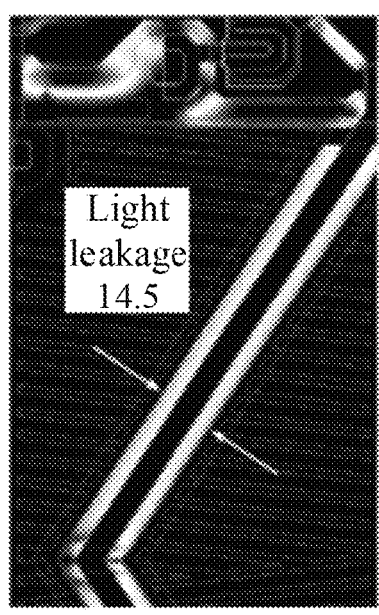
FIG. 5B is a schematic diagram for illustrating light leakage testing of a display product with a shade strip.

In some embodiments, as shown in FIGS. 3D-3G and FIGS. 4E-4G, the display substrate further includes a shade strip 43 disposed at the side of the common electrode strip 3 facing away from the base substrate 1, and an orthographic projection on the base substrate 1 of the shade strip 43 covers a part of the orthographic projection of the common electrode block 31 on the base substrate 1 close to the first slit 30. In the embodiment of the disclosure, the common electrode strip 3 does not cover the data line 21, an electric field generated by the changing data line 21 may not be shielded, and there is no vertical electric field between the bent data line 21 and the comb-shaped pixel electrode 5, and liquid crystal deflection causes region light leakage. In view of this, compared with a display product in the prior art having a linear data line 21, a very wide black matrix is needed to cover the data line 21, and a large aperture ratio loss is caused as a result. In order to improve an aperture ratio, in the embodiment of the disclosure, along the bent data line 21 and above an edge of the common electrode block 31, the shade strip 43 is added for light shade, a light leakage region may be reduced, a width of the black matrix may be reduced, and the aperture ratio may be increased. Specifically, a test is performed by taking display products without the shade strip and with the shade strip as examples, as shown in FIGS. 5A and 5B, FIG. 5A is a schematic diagram of light leakage of the display product without the shade strip, FIG. 5B is a schematic diagram of light leakage of the display product with the shade strip, the light leakage region is reduced from 22.9 μm in FIG. 5A to 14.5 μm in FIG. 5B, the width of the black matrix may be reduced from 32.9 μm to 24.5 μm m, and the aperture ratio is increased from 42% to 50.9%, which is better than those of a traditional display product with a linear data line 21.

In some embodiments, as shown in FIG. 3D, the orthographic projection of the shade strip 43 on the base substrate 1 and the orthographic projection of the first slit 30 on the base substrate 1 do not overlap each other.

In some embodiments, as shown in FIGS. 3A-3D and FIGS. 4A-4G, the orthographic projection of the shade strip 43 on the base substrate 1 and the orthographic projection of the first slit 30 on the base substrate 1 are similar in shape. In this way, light leakage at the first slit 30 may be well shaded.

In some embodiments, as shown in FIGS. 3E and FIG. 4E, in the second direction Y, the shade strip 43 has a length k3 approximately the same as a length k4 of the first signal line portion 201.

In some embodiments, as shown in FIGS. 3G, 4G and 3D, the shade strip 43 is disposed in the gate layer 4. In the embodiment of the disclosure, the shade strip 43 is disposed in the gate layer 4, such that the light leakage at the first slit 30 may be shaded properly and the aperture ratio of the display substrate may be increased without increasing a process of the display substrate.

Figure 6A:
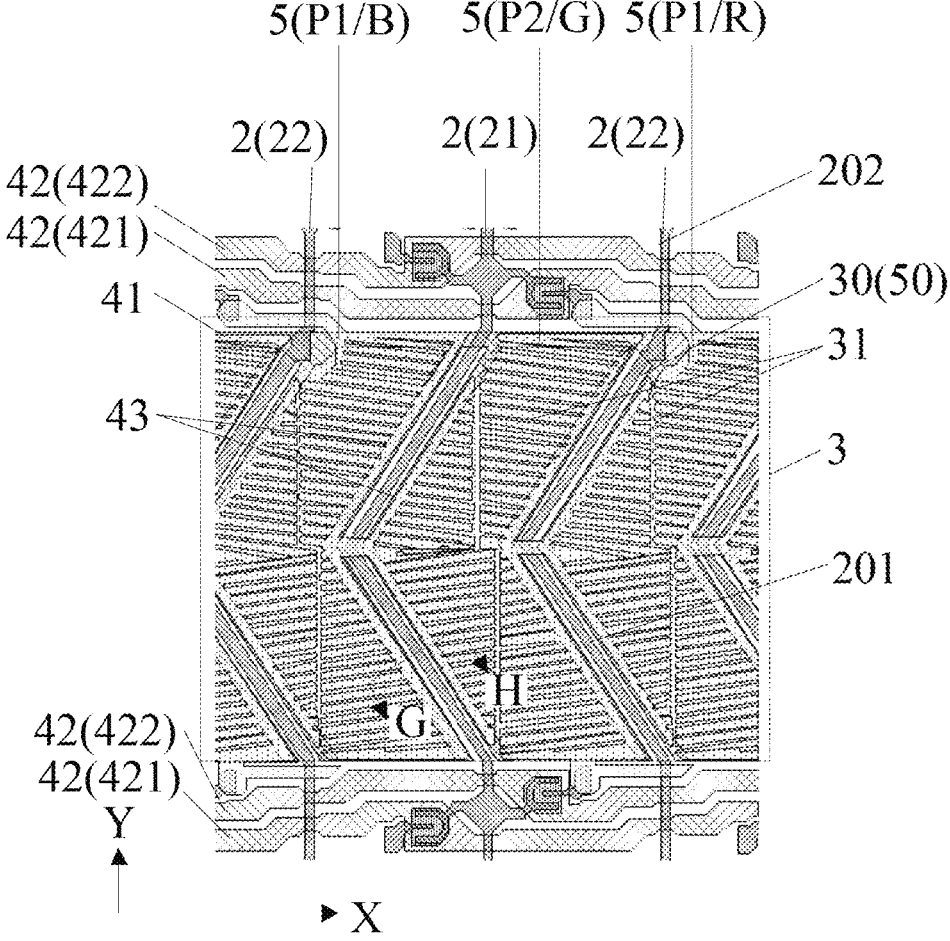
FIG. 6A is a schematic diagram of film layers with a stacked pixel electrode layer as compared to that in FIG. 3E.
Figure 6B:
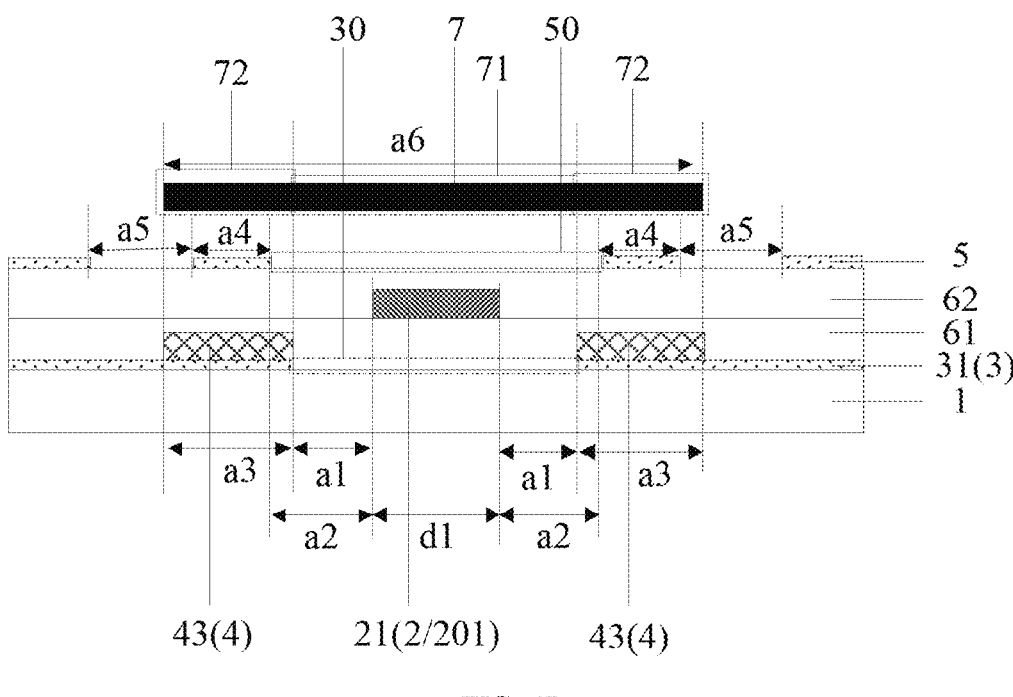
FIG. 6B is a schematic diagram of a section along a dotted line GH shown in FIG. 6A.
Figure 6C:
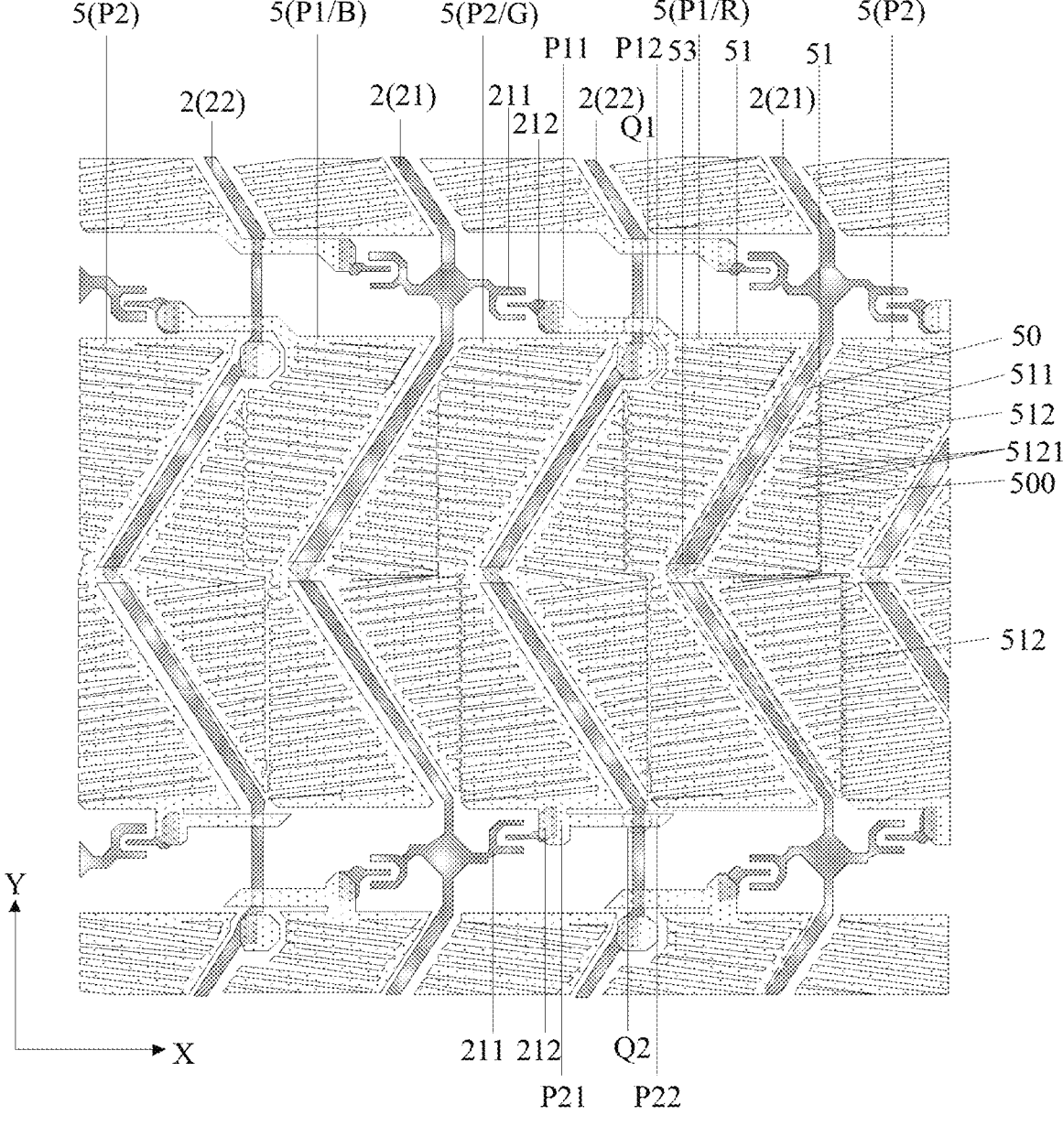
FIG. 6C is a schematic diagram of a pixel electrode layer and a data line layer in stack.
Figure 6D:
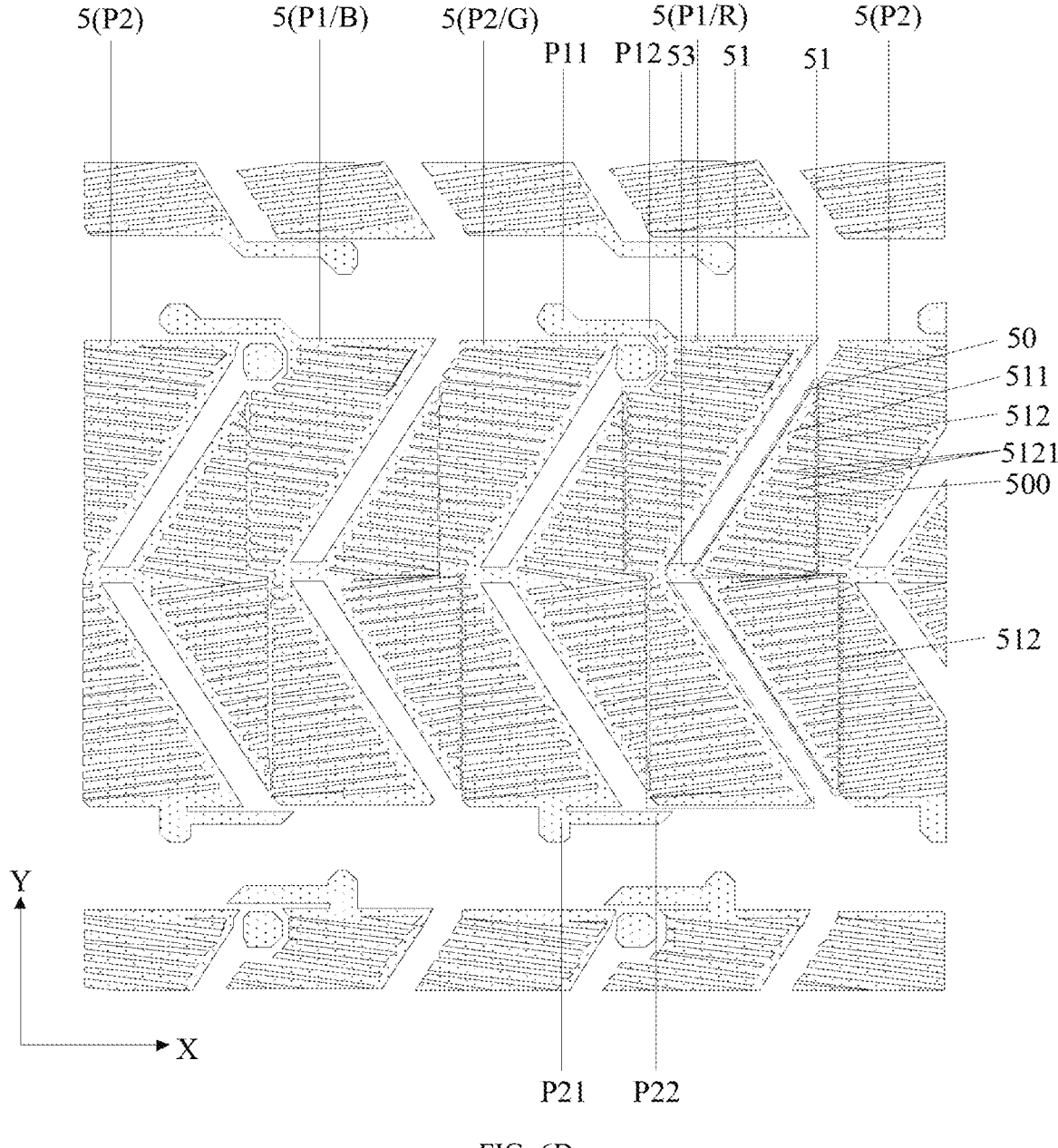
FIG. 6D is a schematic diagram of a single film layer of a pixel electrode layer.
Figure 6E:
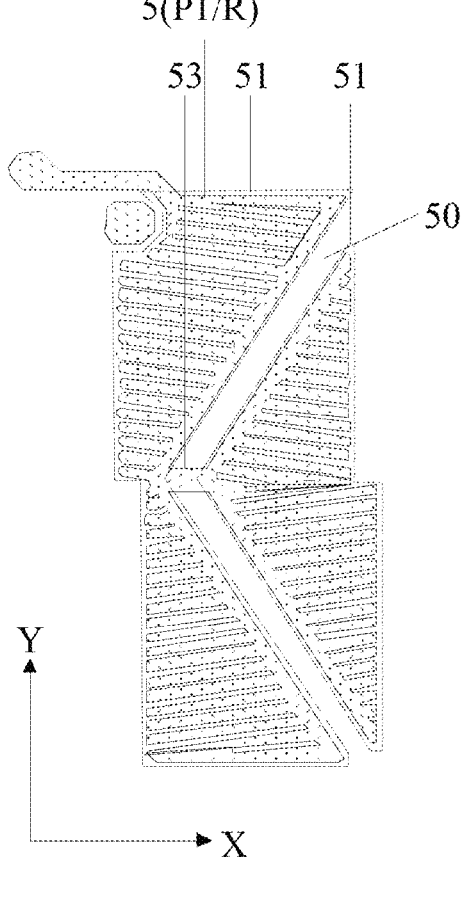
FIG. 6E is a schematic diagram of a pixel electrode.
Figure 6F:
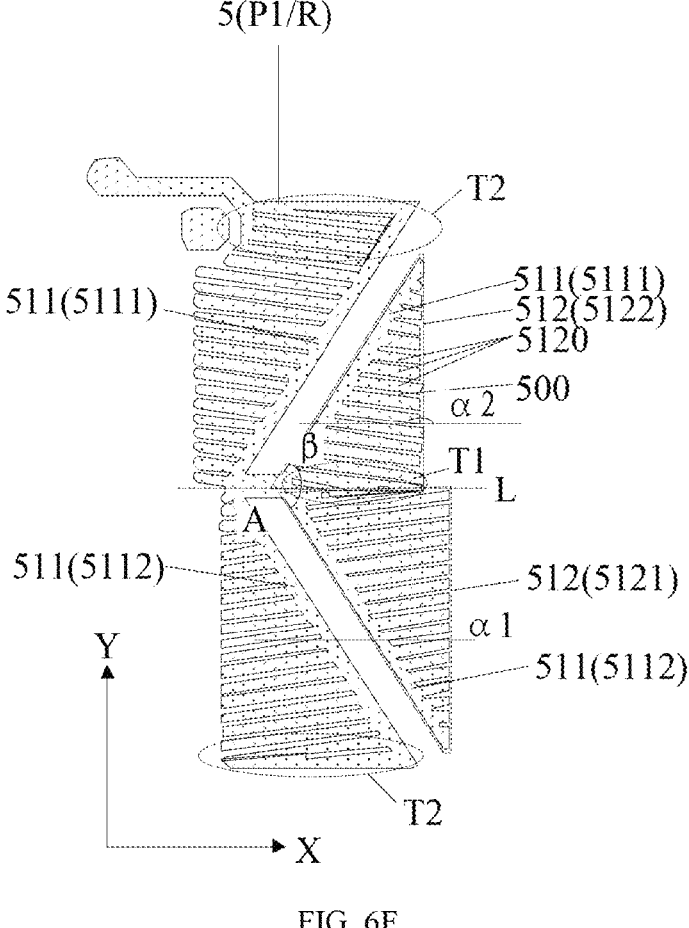
FIG. 6F is another schematic diagram of a pixel electrode.

In some embodiments, as shown in FIGS. 6A-6F, FIG. 7 and FIG. 8, FIG. 6B is a schematic diagram of a section along a dotted line GH shown in FIG. 6A, FIG. 6C is a schematic diagram of an overlap layer of a pixel electrode layer and a data line layer shown in FIG. 6A, FIG. 6D is a schematic diagram of a single film layer of a pixel electrode layer shown in FIG. 6A, FIG. 6E is a schematic diagram of a pixel electrode, and FIG. 6F is another schematic diagram of a pixel electrode. The display substrate further includes a plurality of pixel electrodes 5 disposed at a side of the data line layer 2 facing away from the base substrate 1. The pixel electrode 5 includes two sub-pixel electrode portions 51 arranged in the first direction X and a bridge portion 53 connecting the two sub-pixel electrode portions 51, and a second slit 50 is provided between the two sub-pixel electrode portions 51. In the embodiment of the disclosure, considering that the data line 21 needed to be bent, an overlap between the pixel electrode 5 and the bent data line 21 is hollowed out and divided into two portions at two sides of the data line 21. A left half electrode and a right half electrode are arranged along the bent data line 21 and are connected at a corner of the data line 21 to form a whole, and an edge uses an open slit structure to improve light efficiency and reduce the dark spot. This pixel design may greatly reduce overlap capacitance of the data line 21, the pixel electrode 5 and the common electrode strip 3, and may be applied to products with different sizes, especially the large-size product.

Specifically, in the second direction Y, the bridge portion 53 may have a width about 5 μm-6 μm, so as to avoid a problem of an increase in the overlap capacitance with the data line 21 caused by an exceedingly-large width, or a problem of a poor connection conduction due to vulnerability to rupture in the case of an exceedingly-small width.

In some embodiments, as shown in FIGS. 6A-6C, the orthographic projection of the signal line 2 on the base substrate 1 is located within an orthographic projection of the second slit 50 on the base substrate 1.

In some embodiments, as shown in FIGS. 6B, the orthographic projection of the first slit 30 on the base substrate 1 is located within the orthographic projection of the second slit 50 on the base substrate.

In some embodiments, as shown in FIGS. 6A-6F, FIG. 7 and FIG. 8, the sub-pixel electrode portion 51 includes a skeleton portion 511 and a plurality of branch groups 512. The skeleton portion 511 is in a shape of a bent line having a body extending in the second direction Y, the plurality of branch groups 512 extend from the skeleton portion 511 to a side facing away from the second slit 50, and outer edges of adjacent branch groups 512 connected with the same skeleton 511 protrude outward alternatively. In the embodiment of the disclosure, the pixel electrode 5 is bent, that is, a dark spot between adjacent pixel electrodes 5 is divided into left and right segments, such that the dark spot is misaligned and slanted. As shown in FIG. 6C, for example, each sub-pixel electrode portion 51 is divided into an upper portion and a lower portion, and the upper portion is shifted leftwards and the lower portion is shifted rightwards, so as to further eliminate the moire pattern.

In some embodiments, as shown in FIGS. 6A-6F, FIG. 7 and FIG. 8, the plurality of branch groups 512 include first branch groups 5121 and second branch groups 5122. In the plurality of branch groups 512 connected with the same skeleton portion 511, the first branch groups 5121 and the second branch groups 5122 are alternately arranged, and an outer edge of the first branch group 5121 protrudes relative to an outer edge of the second branch group 5122.

Figure 7:
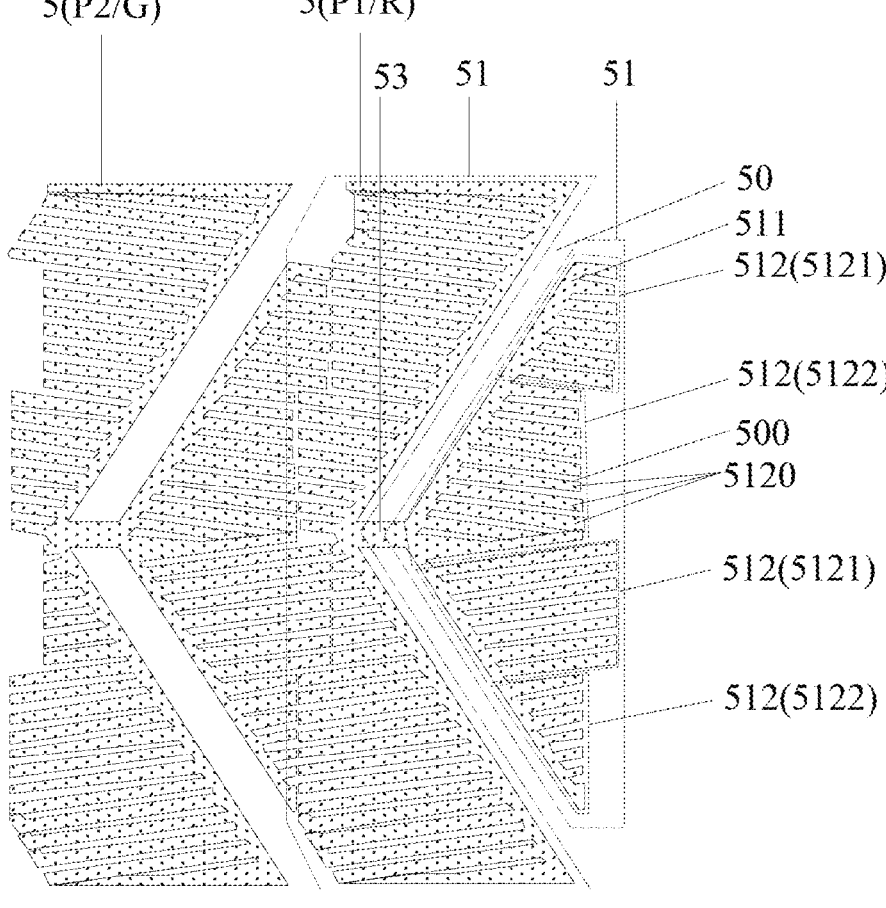
FIG. 7 is a schematic diagram of another pixel electrode according to an embodiment of the disclosure.
Figure 8:
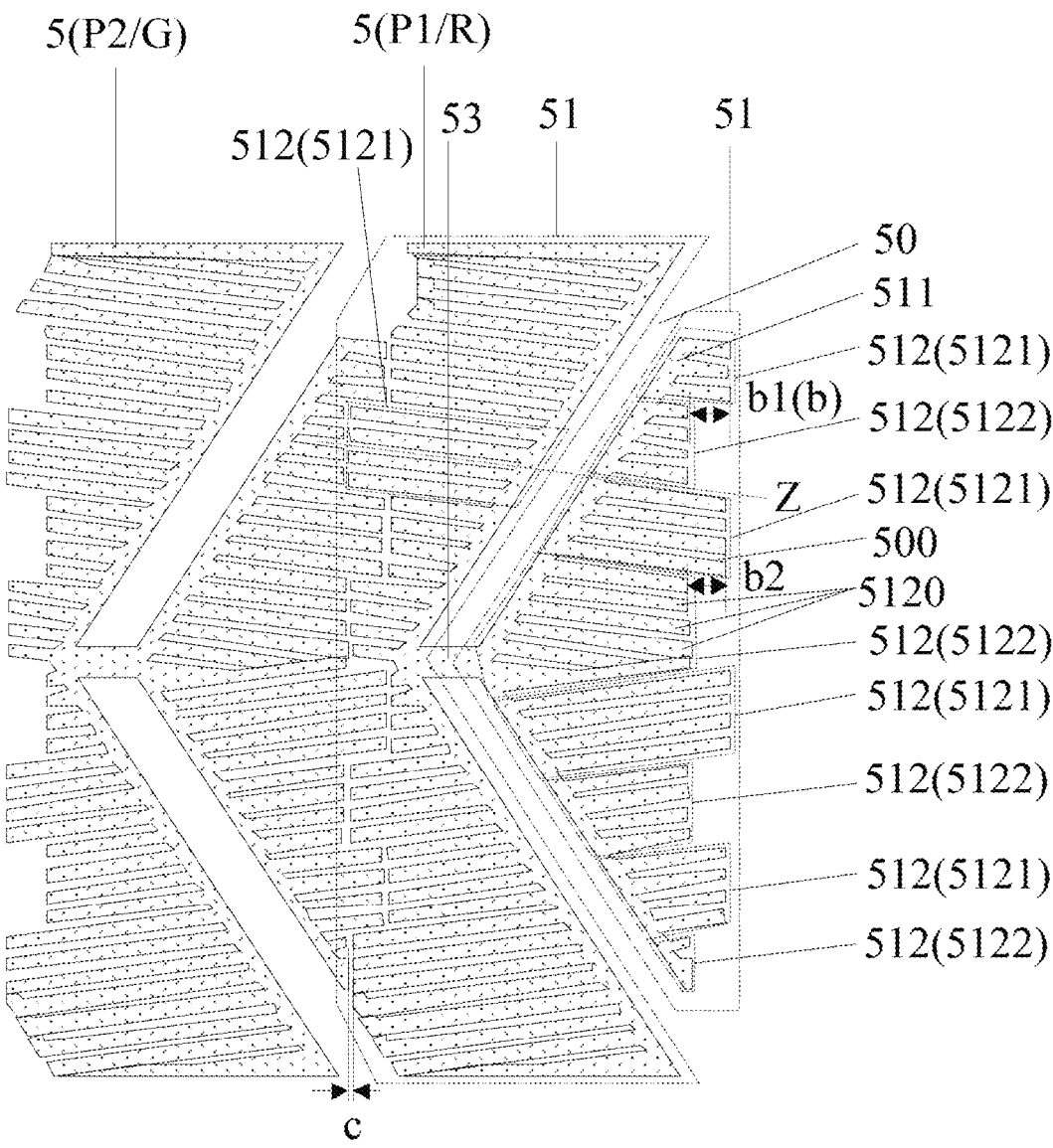
FIG. 8 is a schematic diagram of another pixel electrode according to an embodiment of the disclosure.

In some embodiments, as shown in FIGS. 6A-6F, FIG. 7 and FIG. 8, sizes of protrusions of the first branch groups 5121 relative to the second branch groups 5122 are approximately the same. Specifically, as shown in FIG. 8, for example, from top to bottom of a right sub-pixel electrode portion 51, a protrusion of a first one of first branch groups 5121 relative to the first one of second branch groups 5122 has a size b1 approximately the same as a size b2 of a protrusion of a second one of first branch groups 5121 relative to the second one of second branch groups 5122. In this way, simplification of a manufacturing process of the pixel electrode 5 may be facilitated. It is certain that during specific implementation, protrusions of different first branch groups 5121 relative to the second branch group 5122 may be different, such that the dark spot between adjacent pixel electrodes 5 may be further weakened.

It should be noted that due to limited accuracy of an actual process, it is difficult to satisfy the requirement that the sizes of the protrusions of the first branch groups 5121 relative to the second branch groups 5122 are exactly the same. In the embodiment of the disclosure, the sizes of the protrusions of the first branch groups 5121 relative to the second branch groups 5122 are approximately the same; in other words, a ratio between differences in sizes of the protrusions of the first branch groups 5121 relative to the second branch groups 5122 and a size of any of the two is less than 10%.

In some embodiments, as shown in FIGS. 6A-6F, FIG. 7 and FIG. 8, the size b of the protrusions of the first branch groups 5121 relative to the second branch groups 5122 is 2-5 times as large as a spacing c between adjacent pixel electrodes 5. In this way, under the condition that normal working of the pixel electrode 5 of the display substrate is not affected, an effect of weakening the dark spot between adjacent pixel electrodes 5 is better, so as to avoid excessively large bending, heavier color mixing effects, excessively small bending and insignificant slanting of the dark spot.

Specifically, for example, the size b of the protrusions of the first branch groups 5121 relative to the second branch groups 5122 are 2 times, 3 times, 4 times or 5 times as large as the spacing between adjacent pixel electrodes 5. For example, the spacing c between adjacent pixel electrodes 5 is 3 μm, and the size b of the protrusions of the first branch groups 5121 relative to the second branch groups 5122 is 6 μm. The spacing c between adjacent pixel electrodes 5 may be 3.5 μm, or may be reduced to 3 μm or lower according to accuracy of an exposure machine under the condition of avoiding a poor process. The sizes b of the protrusions of the first branch groups 5121 relative to the second branch groups 5122 may be reduced to 1 μm, 2 μm, 3 μm, 4 μm or 5 μm. Specifically, considering that position accuracy of a color film exposure machine is ±3 μm, a maximum pattern deviation of adjacent pixel electrodes 5 may be 6 μm, so as to avoid excessively large bending, heavier color mixing effects, excessively small bending and insignificant slanting of the dark spot.

In some embodiments, as shown in FIGS. 6A-6F, FIG. 7 and FIG. 8, the numbers of the first branch group 5121 and the second branch group 5122 connected with the same skeleton portion 511 are approximately the same. In this way, simplification of the manufacturing process of the pixel electrode 5 may be facilitated. Specifically, for example, as shown in FIG. 6F, in the right sub-pixel electrode portion 51, the numbers of first branch group 5121 and second branch group 5122 connected with the same skeleton section 511 both are one. For example, as shown in FIG. 7, in the right sub-pixel electrode portion 51, the numbers of the first branch group 5121 and the second branch group 5122 both are 2. For example, as shown in FIG. 8, in the right sub-pixel electrode portion 51, the numbers of the first branch group 5121 and the second branch group 5122 both are. It is certain that during specific implementation, the numbers of the first branch group 5121 and the second branch group 5122 connected with the same skeleton portion 511 may be different, such that the dark spot between adjacent pixel electrodes 5 may be further weakened.

In some embodiments, as shown in FIG. 6A-6F, FIG. 7 and FIG. 8, first branch groups 5121 of different sub-pixel electrode portions 51 in the same pixel electrode 5 are staggered in an extension direction Z parallel to the first branch groups 5121, and second branch groups 5122 of different sub-pixel electrode portions 51 in the same pixel electrode 5 are staggered in the extension direction parallel to the first branch group 5121. Specifically, for example, in FIG. 8, a second one of first branch groups 5121 from top to bottom of a right sub-pixel electrode portion 51 in a right pixel electrode 5 is staggered from a second one of first branch groups 5121 from top to bottom of a left sub-pixel electrode portion 51 in the right pixel electrode 5. That is, a start of the second first branch group 5121 from top to bottom of the right sub-pixel electrode portion 51 in the right pixel electrode 5 corresponds to a middle of the second first branch group 5121 from top to bottom of the left sub-pixel electrode portion 51 in the right pixel electrode 5, as shown by a dotted line Z in FIG. 8. In the embodiment of the disclosure, the first branch groups 5121 of different sub-pixel electrode portions 51 in the same pixel electrode 5 are staggered in the extension direction Z parallel to the first branch groups 5121, and the second branch groups 5122 of different sub-pixel electrode portions 51 in the same pixel electrode 5 are staggered in the extension direction parallel to the first branch group 5121, such that an edge of the pixel electrode 5 is asymmetric as a whole, and the dark spot at the edge of the pixel electrode 5 may be better weakened.

In some embodiments, as shown in FIG. 6A-6F, FIG. 7 and FIG. 8, each branch group 512 may include: a plurality of branches 5120 extending from the skeleton portion 511 to a side facing away from the second slit 50, and a third slit 500 is provided between adjacent branches 5120 in the same branch group 512; and outer edges, facing away from the second slit 50, of the plurality of branches 5120 in the same branch group 512 are approximately flush.

In some embodiments, as shown in FIG. 6A-6F, FIG. 7 and FIG. 8, outer edges of branches 5120 of the first branch groups 5121 in the same sub-pixel electrode portion 51 are all approximately flush, and outer edges of branches 5120 of the second branch groups 5122 in the same sub-pixel electrode portion 51 are all approximately flush. In this way, simplification of the manufacturing process of the pixel electrode 5 may be realized. It is certain that during specific implementation, the outer edges of branches 5120 of the first branch groups 5121 in the same sub-pixel electrode portion 51 may not be flush, and the outer edges of branches 5120 of the second branch groups 5122 in the same sub-pixel electrode portion 51 may not be flush, such that the dark spot between adjacent pixel electrodes 5 may be further weakened.

In some embodiments, as shown in FIG. 6A-6F, FIG. 7 and FIG. 8, the number of branch 5120 contained in at least part of the first branch groups 5121 is approximately the same as the number of branches 5120 contained in at least part of the second branch groups 5122. Specifically, for example, in FIG. 8, a first one of second branch groups 5122 from top to bottom of the right sub-pixel electrode portion 51 includes four branches 5120, a second one of first branch groups 5121 from top to bottom of the right sub-pixel electrode portion 51 includes four branch groups 5120, and the numbers are the same. In this way, simplification of the manufacturing process of the pixel electrode 5 may be realized. It is certain that during specific implementation, the number of branch 5120 contained in the first branch groups 5121 may be the same as or different from the number of branches 5120 contained in the second branch groups 5122, such that the dark spot between adjacent pixel electrodes 5 may be further weakened.

In some embodiments, as shown in FIG. 6A-6F, FIG. 7 and FIG. 8, patterns of outer edge of branch groups 512 of the adjacent pixel electrodes are complementary to each other. Specifically, the first branch group 5121 of the pixel electrode 5 is arranged facing the second branch group 5122 of the adjacent pixel electrode 5. Specifically, for example, as shown in FIG. 8, a protruding first branch group 5121 of the left sub-pixel electrode portion 51 in the right pixel electrode 5 faces a recessed second branch group 5122 of the right sub-pixel electrode 51 in the left pixel electrode 5, so as to weaken such that the dark spot between adjacent pixel electrodes 5.

In some embodiments, as shown in FIG. 6C, the data line layer 2 further includes a first electrode 211 electrically connected with the data line 21 and a second electrode 212 separated from the first electrode 211. As shown in FIGS. 6A-6F, the pixel electrode 5 includes a first type of pixel electrode P1 and a second type of pixel electrode P2 alternately arranged in the first direction X, where the first type of pixel electrode P1 includes: a first adaptation portion P11 and a first connection portion P12, the first connection portion P12 crosses the first connection line 22 to connect the first adaptation portion P11 with one sub-pixel electrode portion 51 therein, and an orthographic projection of the first adaptation portion P11 on the base substrate 1 and an orthographic projection of the second electrode 212 on the base substrate 1 have an overlapped region. The second type of pixel electrode P2 includes: a second adaptation portion P21 directly connected with one sub-pixel electrode portion 51 therein, and an orthographic projection of the second adaptation portion P21 on the base substrate 1 and the orthographic projection of the second electrode 212 on the base substrate 1 have an overlapped region. The second type of pixel electrode P2 further includes: a compensation portion P22 extending from a side of the second adaptation portion P21 facing away from the data line 21 in the first direction X, and an orthographic projection of the compensation portion P22 on the base substrate 1 overlaps an orthographic projection of the first connection line 22 on the base substrate. During specific implementation, due to charge difficulty of the large-size display product, in order to reduce the number of pins of a source integrated circuit (IC) and reduce cost, dual gate design is used, resulting in that a charging rate is lower, and picture quality is likely to be poor. A conventional dual gate product has half of the pixel electrodes 5 crossing the vertical first connection line 22, while the other half of the pixel electrodes 5 do not cross the same. In order to obtain the better picture quality, the smaller a design difference between different pixel electrodes 5 is, the better the picture uniformity is. Further, in the embodiment of the disclosure, the second type of pixel electrode P2 further includes the compensation portion P22, and the orthographic projection of the compensation portion P22 on the base substrate 1 overlaps the orthographic projection of the first connection line 22 on the base substrate, that is, a capacitance compensation method is used, and a compensation portion P22 (that is, at a dotted circle Q2 in FIG. 6C) is added for the second type of pixel electrode P2 without crossing. A width of the compensation portion P22 as well as a distance thereof from other structures is equivalent to the first connection portion P12 (that is, at a dotted circle Q1 in FIG. 6C) of the first type of pixel electrode P1 with crossing, so as to cause a capacitance difference of signals of the pixel electrodes 5, the common electrode strip 3 and the gate line 42 to be minimized.

Specifically, in some embodiments, the first type of pixel electrode P1 may be, for example, a pixel electrode 5 corresponding to a pixel emitting red light, and the second type of pixel electrode P2 may be a pixel electrode 5 corresponding to a pixel emitting green light.

In some embodiments, as shown in FIG. 6A-6F, FIG. 7 and FIG. 8, an overlapped area formed by the orthographic projection of the compensation portion P22 on the base substrate 1 and the orthographic projection of the first connection line 22 on the base substrate 1 is approximately the same as an overlapped area formed by an orthographic projection of the first connection portion P12 on the base substrate 1 and the orthographic projection of the first connection line 22 on the base substrate 1.

In some embodiments, as shown in FIG. 6A-6F, FIG. 7 and FIG. 8, the orthographic projection of the compensation portion P22 on the base substrate 1 and the orthographic projection of the first connection portion P12 on the base substrate 1 are similar in shape.

In some embodiments, as shown in FIG. 6A-6F, FIG. 7 and FIG. 8, the compensation portion P22 and the second adaptation portion P21 are on the same layer. In this way, the manufacturing process of the display substrate is simplified.

In some embodiments, as shown in FIG. 6A-6F, FIG. 7 and FIG. 8, the sub-pixel electrode portion 51, the bridge portion 53, the first adaptation portion P11 and the first connection portion P12 of the same pixel electrode 5 are in the same layer. In this way, the manufacturing process of the display substrate is further simplified.

In a traditional pixel electrode structure, a circle around an edge of a pixel electrode is a closed electrode skeleton (used to transmit signals), a plurality of transverse slits are provided in the pixel electrode. Liquid crystals are arranged along the slits, and become disordered when arranged at the circle around the edge of the pixel electrode due to a structure of the electrode skeleton, so as to form a display dark spot. Therefore, there is a large dark spot between adjacent sub-pixels which is not conductive to elimination of the moire pattern. Based on the display substrate according to the embodiment of the disclosure, the pixel electrode includes two sub-pixel electrode portions 51, each sub-pixel electrode portion 51 includes the skeleton portion 511 and a comb-shaped structure connected with a side of the skeleton portion 511, and the comb-shaped structure is formed by alternately arranging the plurality of branches 5120 and the plurality of third slits 500. In this way, the electrode skeleton is not arranged at the edge of the pixel electrode structure according to the disclosure, but is moved into the sub-pixel, that is, the edge of the pixel electrode structure is in an open comb-shaped structure, liquid crystals at the edge of the pixel electrode may be arranged in order, the dark spot between the pixel electrodes may be reduced, and in the case that the display substrate according to the embodiment of the disclosure is applied to a 3D display, the moire pattern may be eliminated and the display effect may be improved.

During specific implementation, in the display panel according to the embodiment of the disclosure, the skeleton portion 511 is in a shape of a bent line, and the bent-line-shaped skeleton portion 511 may eliminate the moire pattern caused by interference with the grating of the 3D display, further eliminating the moire pattern in the display screen, and improving the display effect.

During specific implementation, in the display panel according to the embodiment of the disclosure, as shown in FIG. 6F, the skeleton portion 511 in each sub-pixel electrode portion 51 may be divided into a first skeleton sub-portion 5111 and a second skeleton sub-portion 5112 due to a bending point A. In the same pixel electrode 5, branches 5120 on two sides of two first skeleton sub-portions 5111 in the same extension direction correspond to each other and are disposed on the same straight lines, and branches 5120 on two sides of two second skeleton sub-portions 5112 with the same extension direction correspond to each other and are disposed on the same straight lines. In this way, regular arrangement of liquid crystal molecules is facilitated, and the display effect is improved.

During specific implementation, in the display panel according to the embodiment of the disclosure, as shown in FIG. 6F, the branches 5120 connected with the first skeleton sub-portion 5111 are approximately parallel to one another, and the branches 5120 connected with the second skeleton sub-portion 5112 are approximately parallel to one another. In this way, during display by a liquid crystal display panel, liquid crystal molecules may be regularly arranged, and the display effect is improved.

During specific implementation, in the display panel according to the embodiment of the disclosure, as shown in FIG. 6F, the branch 5120 connected with the second skeleton sub-portion 5112 inclines by a first inclination angle α1 relative to the first direction X, the branch 5120 connected with the first skeleton sub-portion 5111 inclines by a second inclination angle α2 relative to the first direction X, and the first inclination angle α1 and the second inclination angle α2 are complementary to each other. The same pixel electrode 5 is provided with the branches 5120 with the complementary inclination angles. In this arrangement mode, the same pixel electrode 5 may have complementary brightness, thus avoiding occurrence of horizontal stripes.

During specific implementation, in the display substrate according to the embodiment of the disclosure, as shown in FIG. 6F, the pixel electrode 5 is provided with a center line L extending in the first direction X, and the bending point A is approximately positioned on the center line L. Due to influence of the manufacturing process, the position of the bending point A may have a certain shift error relative to the center line L, and this structure may eliminate the moire pattern defect to the maximum extent.

During specific implementation, in the display substrate according to the embodiment of the disclosure, as shown in FIG. 6F, the skeleton portion 511 is provided with a bending angle β at a position corresponding to the bending point A. In an area (at an oval dotted box T1) at a side of the bending angle β and close to the bending point A, the plurality of branches 5120 connected respectively with the first skeleton sub-portion 5111 and the second skeleton sub-portion 5112 are electrically connected with one another. In areas (at oval dotted boxes T2) of edges at two sides, opposite the bending angle β and facing away from the bending point A, the plurality of branches 5120 connected with the first skeleton sub-portion 5111 are electrically connected with one another, and the plurality of branches 5120 connected with the second skeleton sub-portion 511 are electrically connected to one another. Ends, facing away from the skeleton portion 511, of branches 5120 at other positions are independent of one another. That is, the edge of the pixel electrode structure is set to be an open comb-shaped structure, such that the liquid crystals at the edge of the pixel electrode may be arranged in order, the dark spot between sub-pixels may be reduced, the moire pattern may be eliminated, and the display effect may be improved. Specifically, the bending angle β may be greater than 90° and less than 180°. In some embodiments, the bending angle β may be set to 114°. It is certain that in an actual application, a specific value of β may be designed according to requirements of the actual application, and is not limited herein.

It should be noted that the display panel in the dual gate structure is illustrated in FIGS. 3A-8. As shown in FIGS. 3E and 6A, the gate lines 42 may include a first gate line 421 and a second gate line 422, and orthographic projections of the first gate line 421 and the second gate line 422 on the base substrate 1 are located in a gap between orthographic projections of two adjacent rows of pixel electrodes 5 on the base substrate 1. Moreover, two gate lines (a first gate line 421 and a second gate line 422) corresponding to the same row of pixel electrodes 5 are located at two sides of the corresponding row of pixel electrodes 5. For example, the first gate line 421 of two gate lines corresponding to the pixel electrodes 5 of the same row is electrically connected with thin film transistors in odd-numbered pixel electrodes 5 in the row, and the other gate line (such as the second gate line 422) is electrically connected with thin film transistors in even-numbered pixel electrodes 5 in the row. The gate line (such as the first gate line 421) electrically connected with the thin film transistors in the odd-numbered pixel electrodes 5 in the row may be arranged above the row, and the gate line (such as the second gate line 422) electrically connected with the thin film transistors in the even-numbered pixel electrodes 5 in the row may be arranged below the row.

Figure 9A:
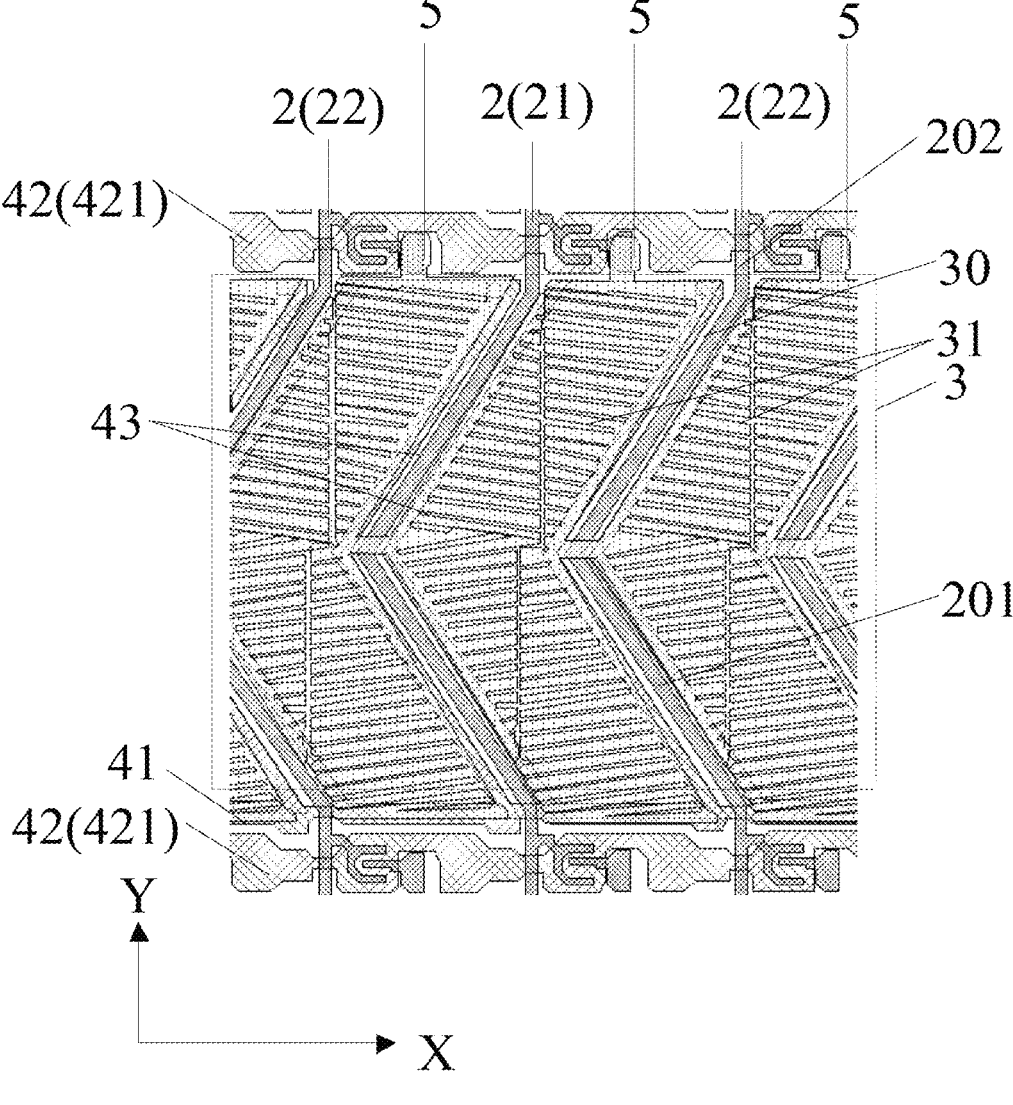
FIG. 9A is a schematic diagram of a display substrate in a single-gate structure including a common electrode layer, a data line layer, a gate layer and a pixel electrode layer in stack.
Figure 9B:
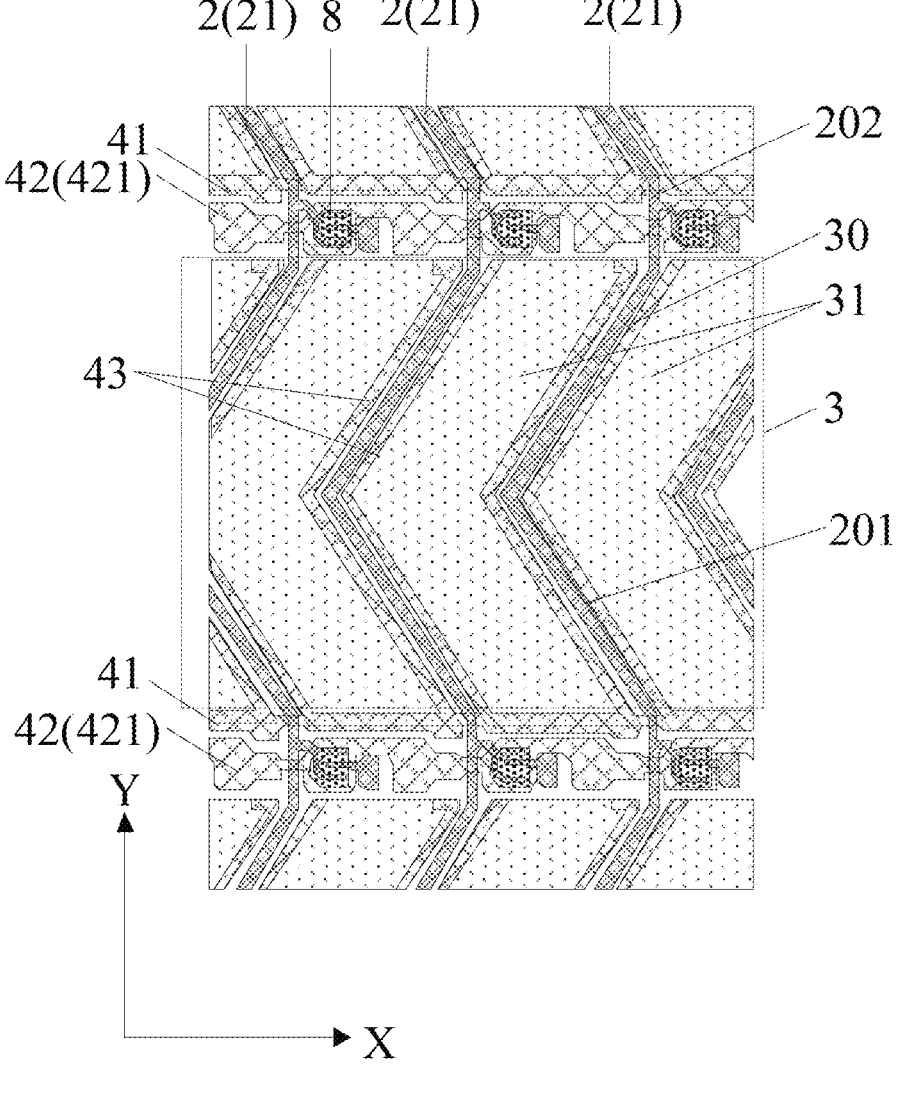
FIG. 9B is a schematic diagram of a display substrate in a single-gate structure including a common electrode layer, a data line layer, and a gate layer in stack.
Figure 9C:
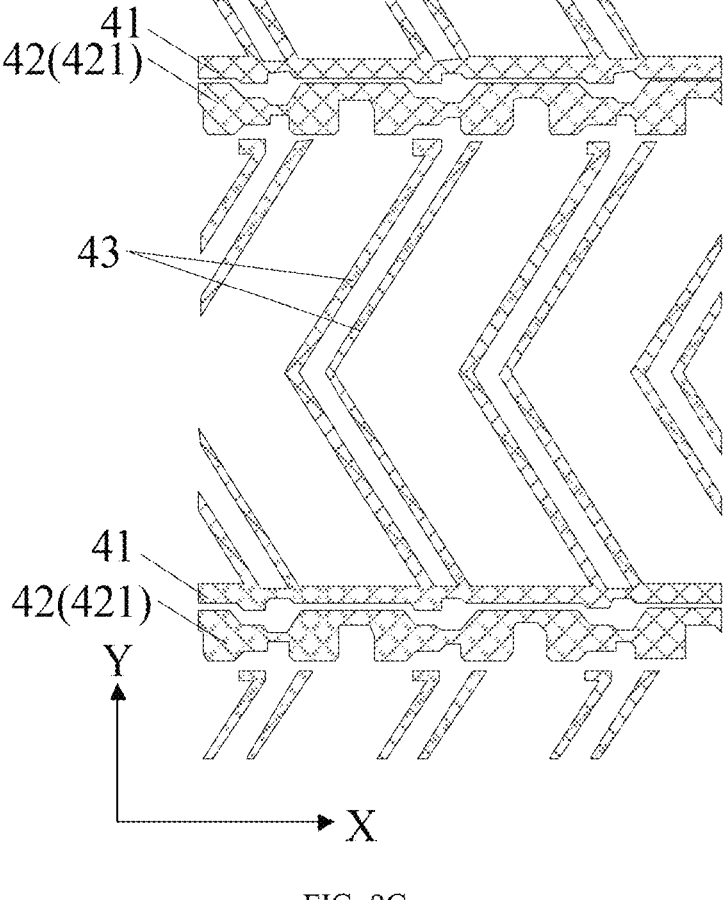
FIG. 9C is a schematic diagram of a film layer of a single gate layer shown in FIG. 9B.

In some embodiments, the display substrate according to the embodiment of the disclosure may also be in a single-gate structure. Specifically, as shown in FIGS. 9A-9C, 9A is a schematic diagram of stacked layers including a common electrode layer, a data line layer, a gate layer and a pixel electrode layer, FIG. 9B is a schematic diagram of stacked layers including a common electrode layer, a data line layer, and a gate layer, and FIG. 9C is a schematic diagram of a film layer of a single gate layer in FIG. 9B. The gate line 42 extends along a row of pixel electrodes 5, and one row of pixel electrodes 5 corresponds to one gate line 42.

Based on the same inventive concept, the embodiment of the disclosure provides a display panel including the display substrate according to the embodiment of the disclosure.

Figure 10A:
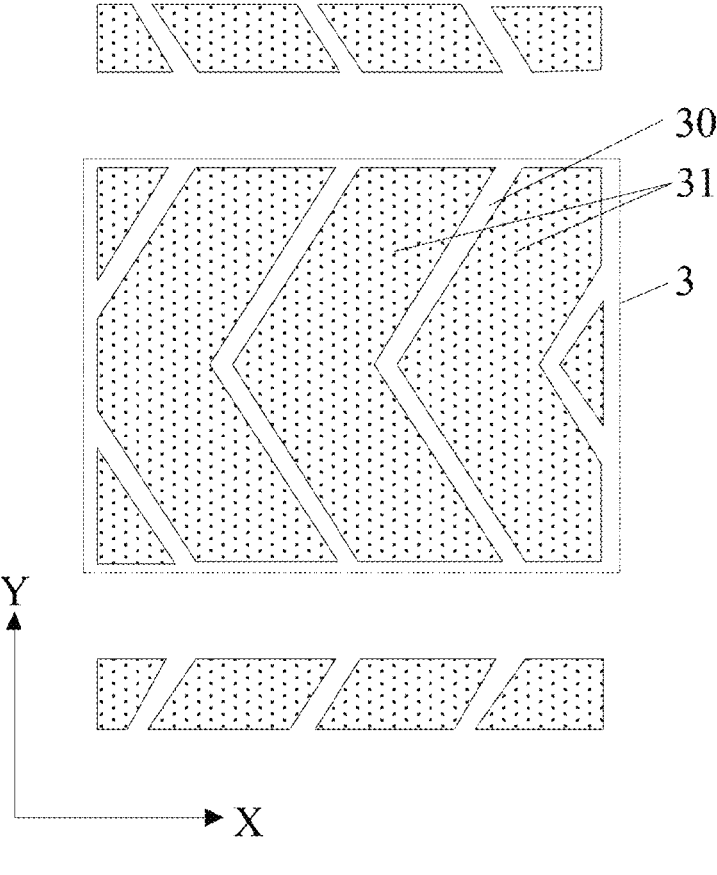
FIG. 10A is a schematic diagram of a common electrode layer formed on a display substrate in a dual gate structure.
Figure 10B:
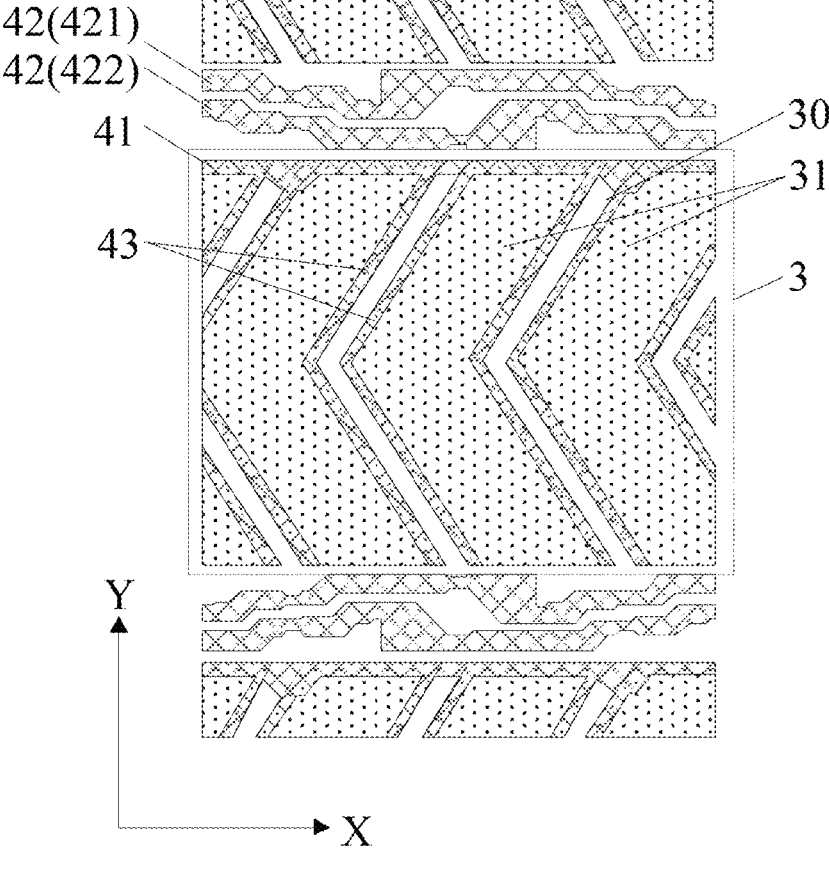
FIG. 10B is a schematic diagram of a gate layer formed on a display substrate in a dual gate structure.
Figure 10C:
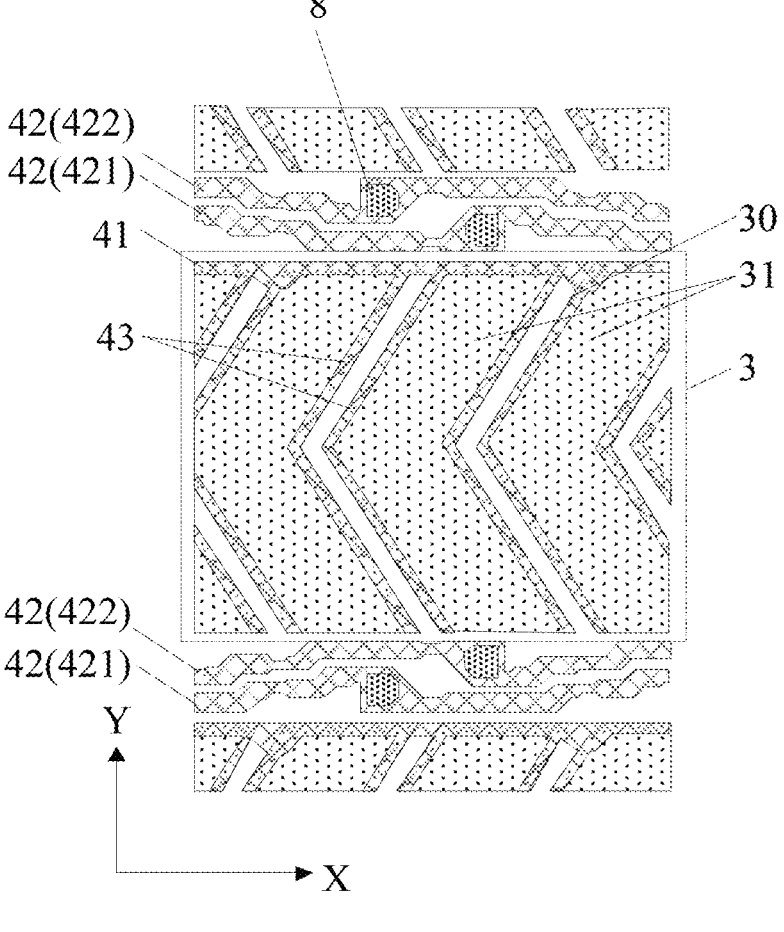
FIG. 10C is a schematic diagram of an active layer formed on a display substrate in a dual gate structure.
Figure 10D:
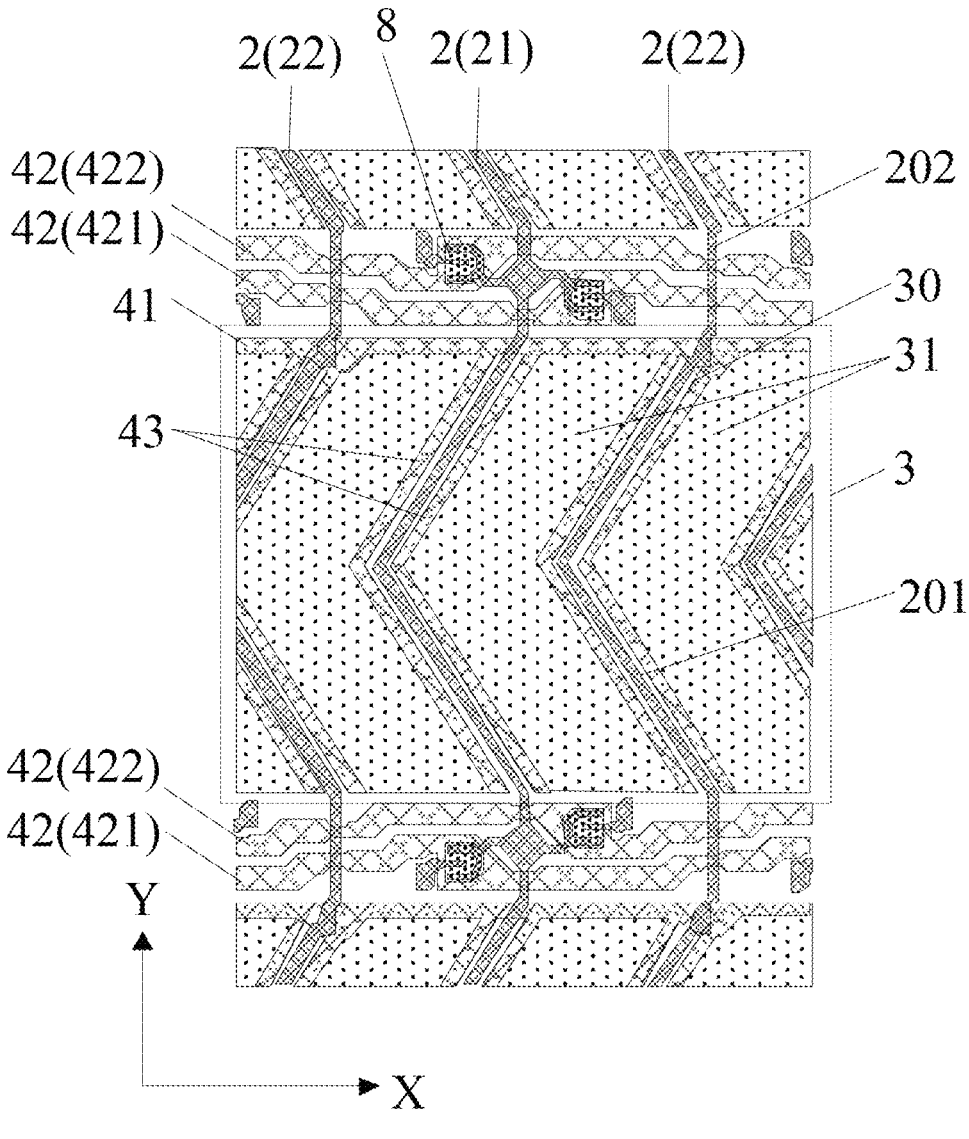
FIG. 10D is a schematic diagram of a common electrode layer formed on a display substrate in a dual gate structure.
Figure 10E:
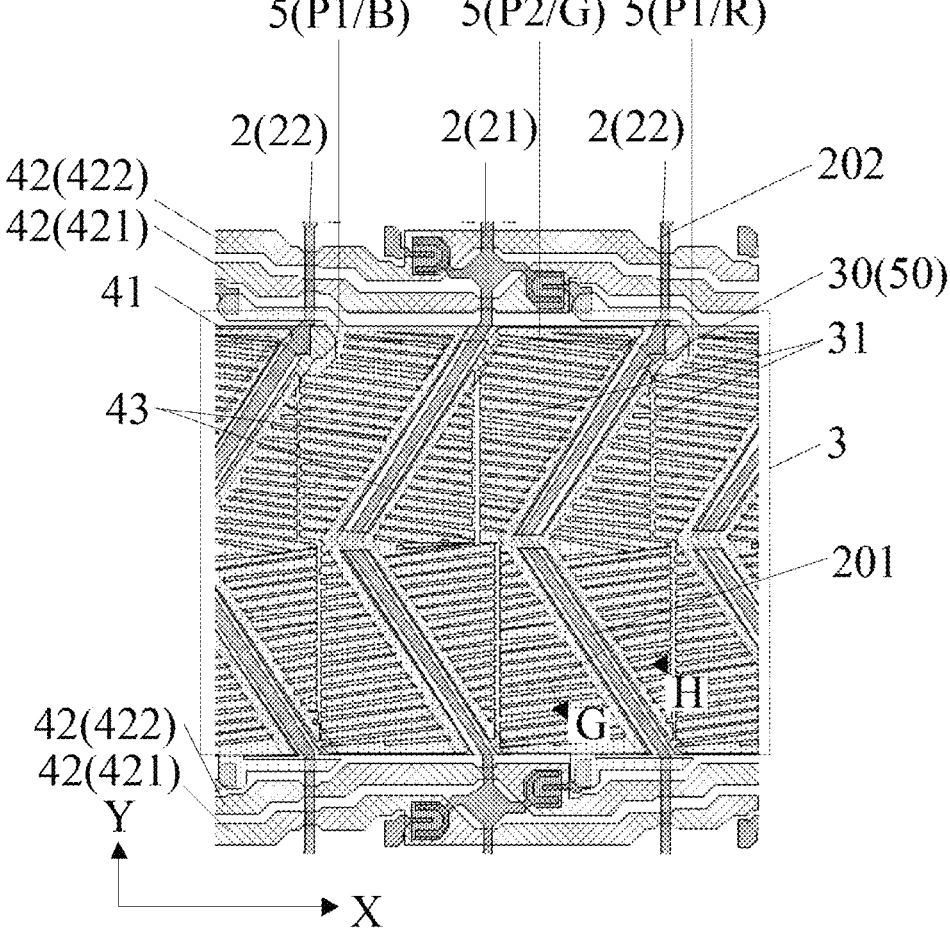
FIG. 10E is a schematic diagram of a pixel electrode layer formed on a display substrate in a dual gate structure.
Figure 10F:
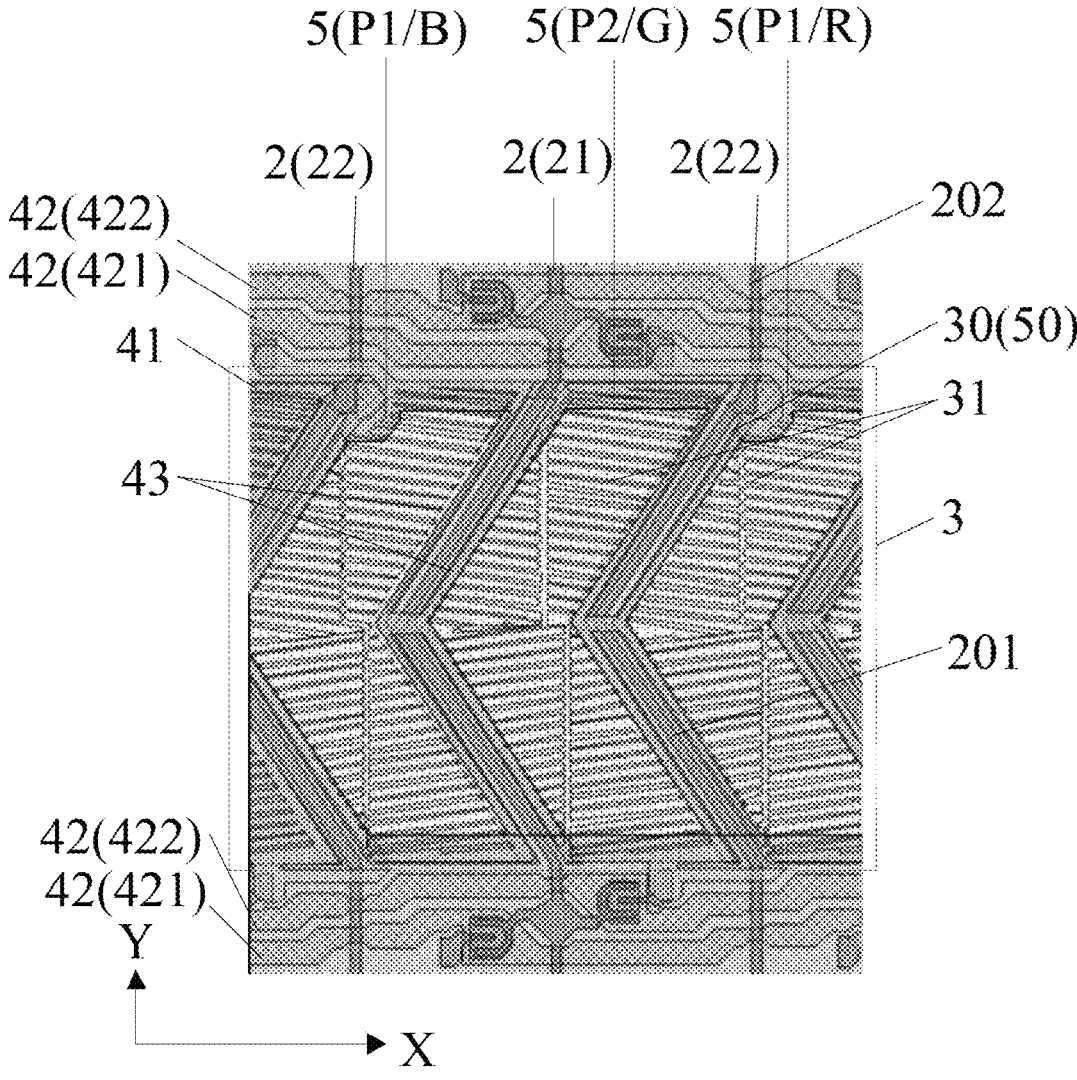
FIG. 10F is a schematic diagram of a black matrix formed on a display substrate in a dual gate structure.
Figure 10G:
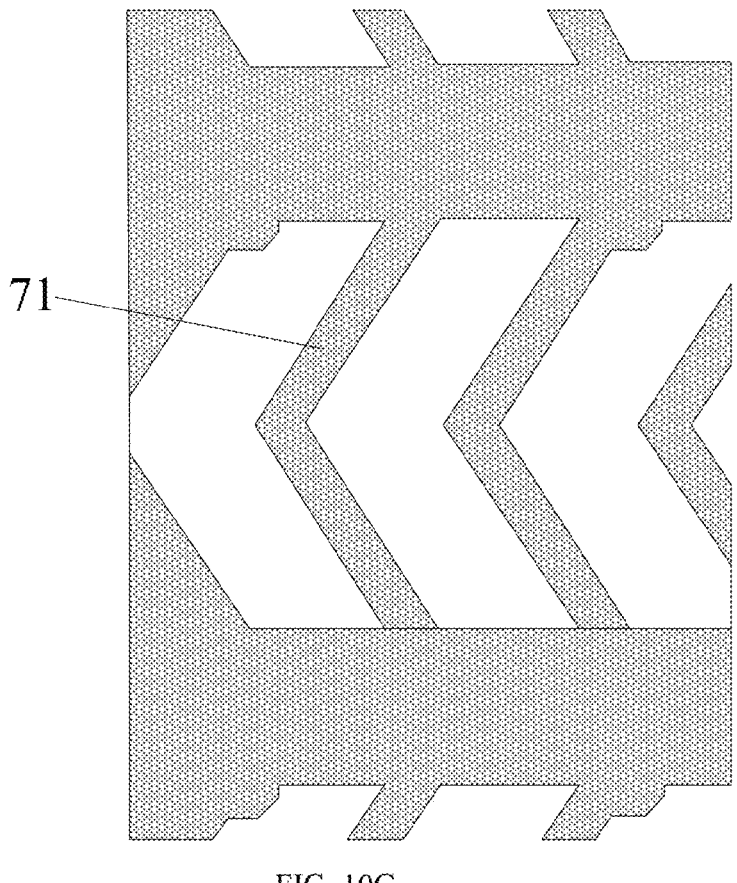
FIG. 10G is a schematic diagram of a single film layer of a black matrix.

In some embodiments, the display panel further includes an opposite substrate arranged opposite to the display substrate; and the opposite substrate includes a black matrix, as shown in FIG. 6B and FIG. 10G, the black matrix includes a first black matrix portion 7 arranged corresponding to a first slit 30, an orthographic projection of the first black matrix portion 7 on a base substrate 1 covers an orthographic projection of a first slit 30 on the base substrate 1, and an outer edge of the first black matrix portion 7 is approximately flush with an outer edge of a shade strip 43 facing away from the first slit 30.

In some embodiments, as shown in FIG. 6B, the first black matrix portion 7 is provided with a first black matrix sub-portion 71 and second black matrix sub-portions 72 at two sides of the first black matrix sub-portion 71, an orthographic projection of the first black matrix sub-portion 71 on the base substrate and the orthographic projection of the first slit 30 on the base substrate 1 coincide with each other, and an orthographic projection of the second black matrix sub-portion 72 on the base substrate 1 and an orthographic projection of the shade strip 43 on the base substrate 1 coincide with each other.

Figure 12A:
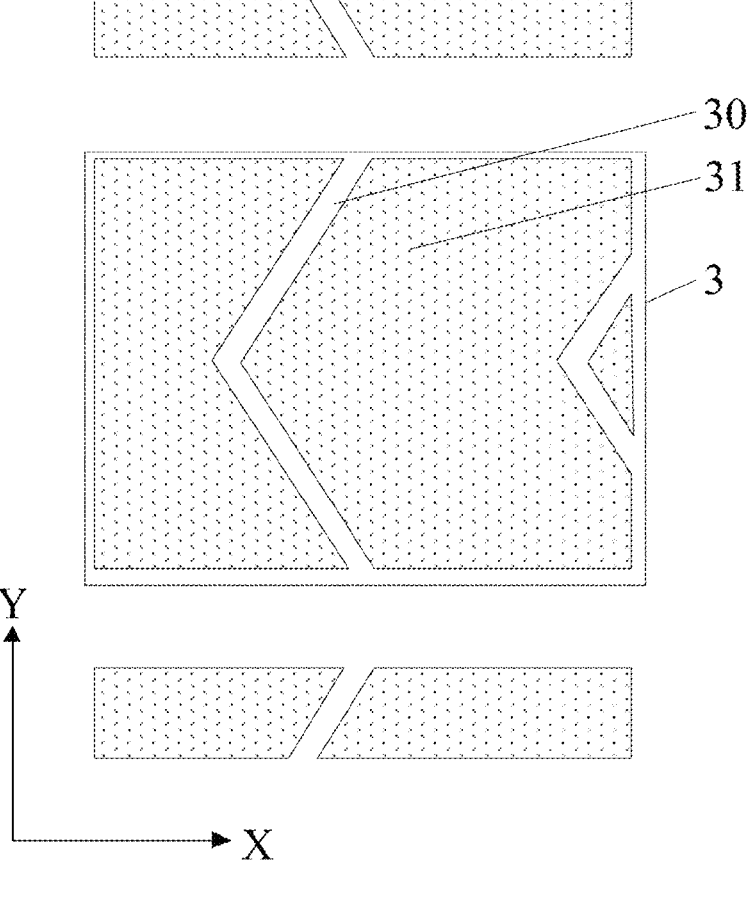
FIG. 12A is a schematic diagram of a common electrode layer formed on a display substrate, where a common electrode strip is merely provided with a first slit for a data line.
Figure 12B:
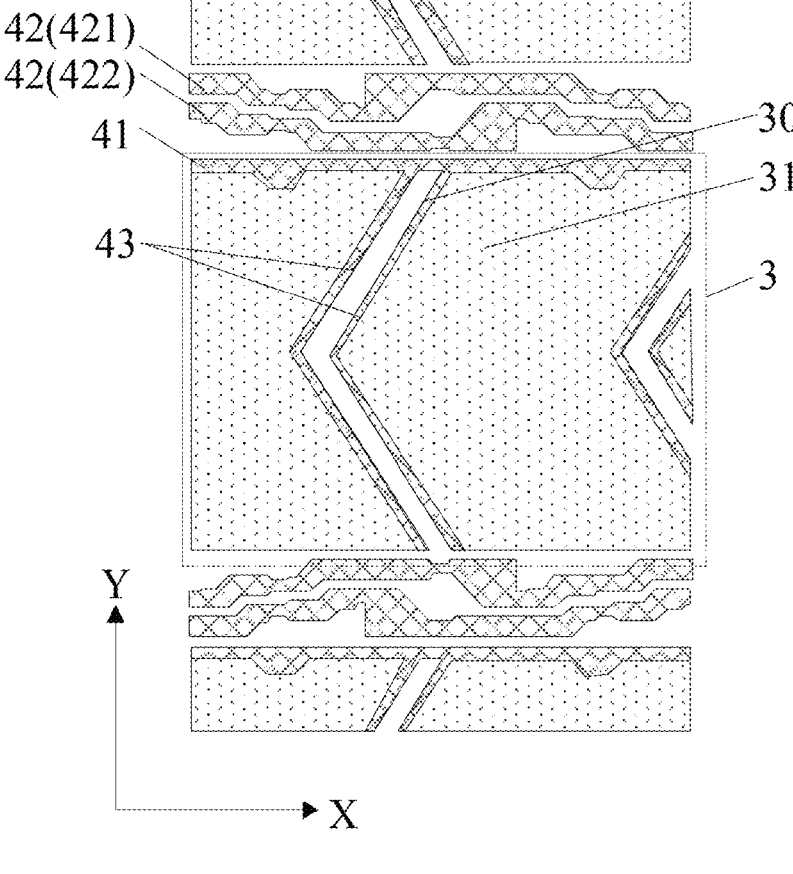
FIG. 12B is a schematic diagram of a gate layer formed on a display substrate, where a common electrode strip is merely provided with a first slit for a data line.
Figure 12C:
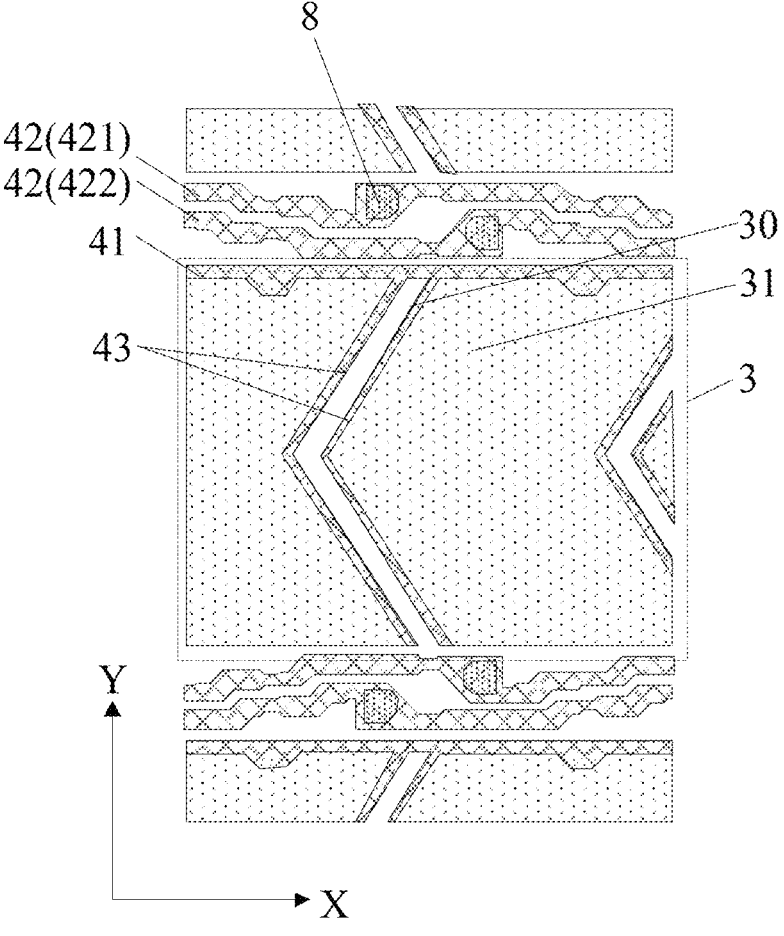
FIG. 12C is a schematic diagram of an active layer formed on a display substrate, where a common electrode strip is merely provided with a first slit for a data line.
Figure 12D:
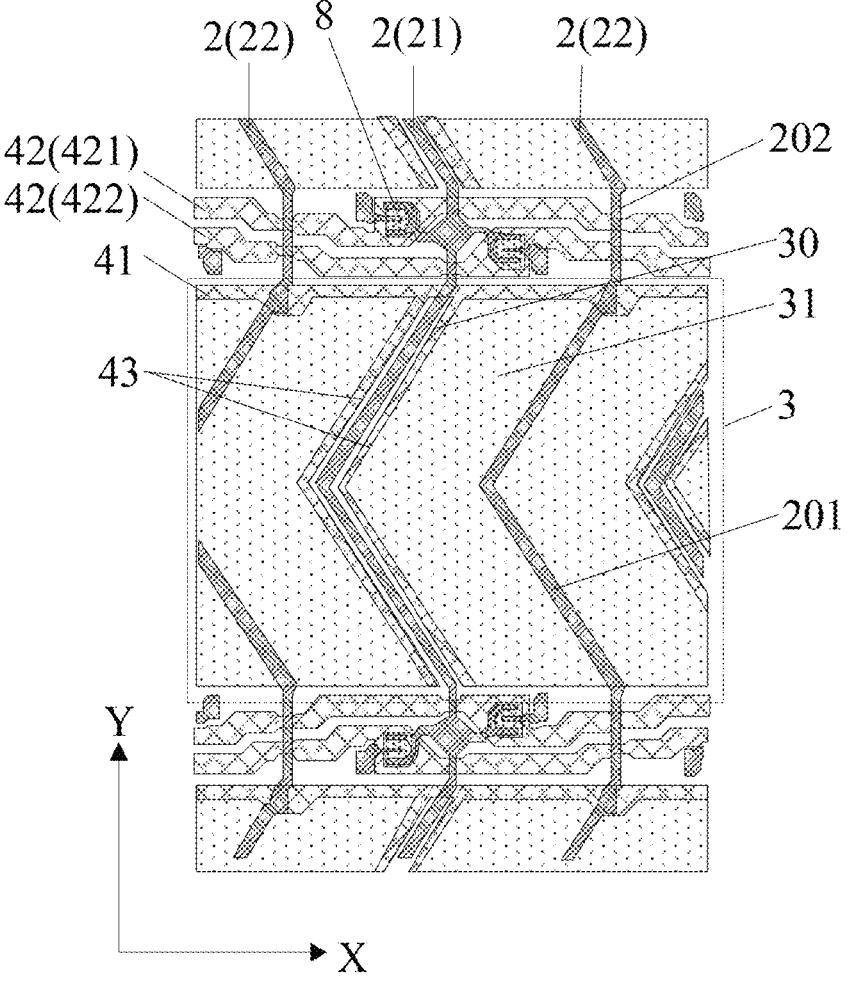
FIG. 12D is a schematic diagram of a common electrode layer formed on a display substrate, where a common electrode strip is merely provided with a first slit for a data line.
Figure 12E:
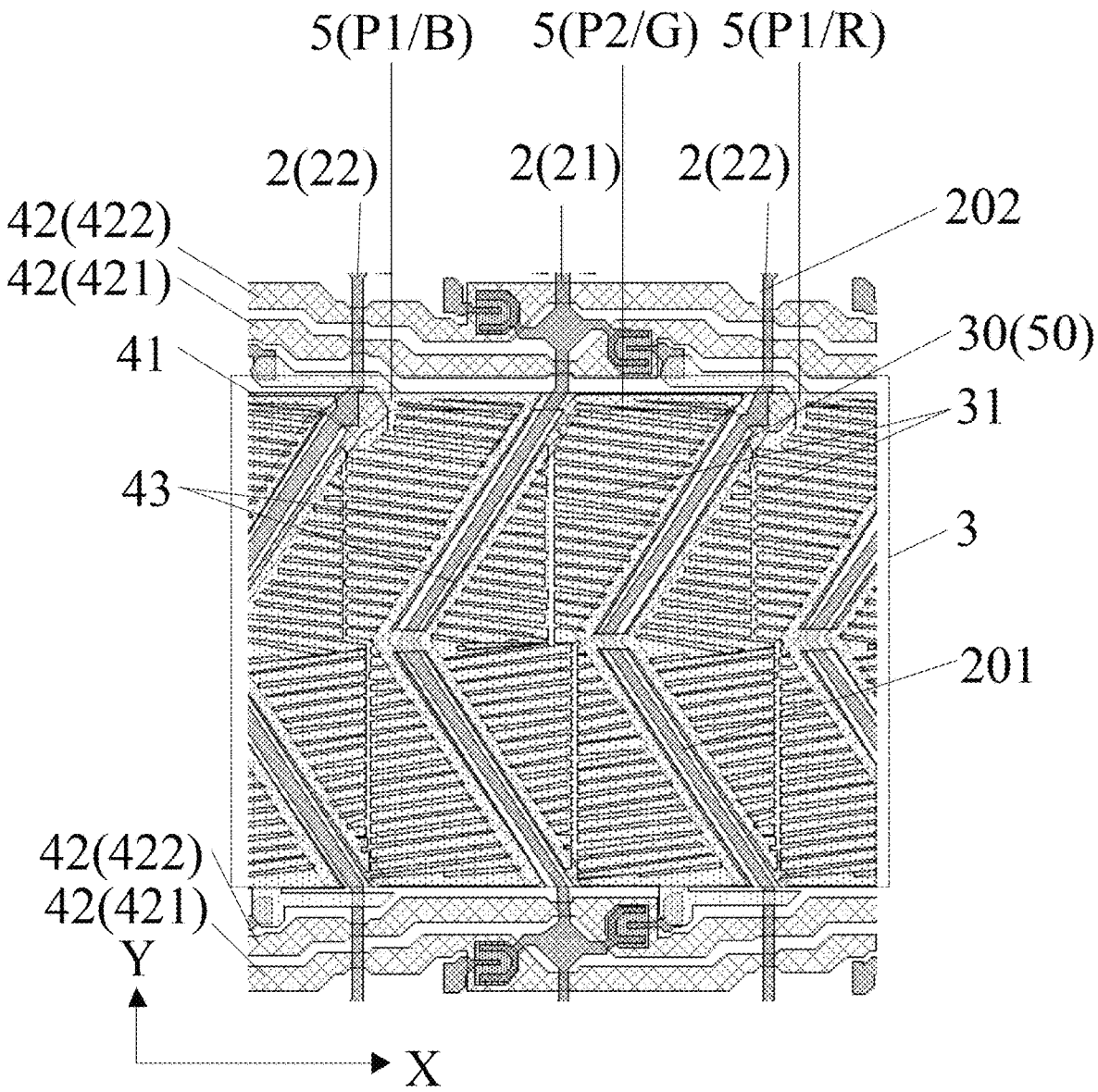
FIG. 12E is a schematic diagram of a pixel electrode layer formed on a display substrate, where a common electrode strip is merely provided with a first slit for a data line.
Figure 12F:
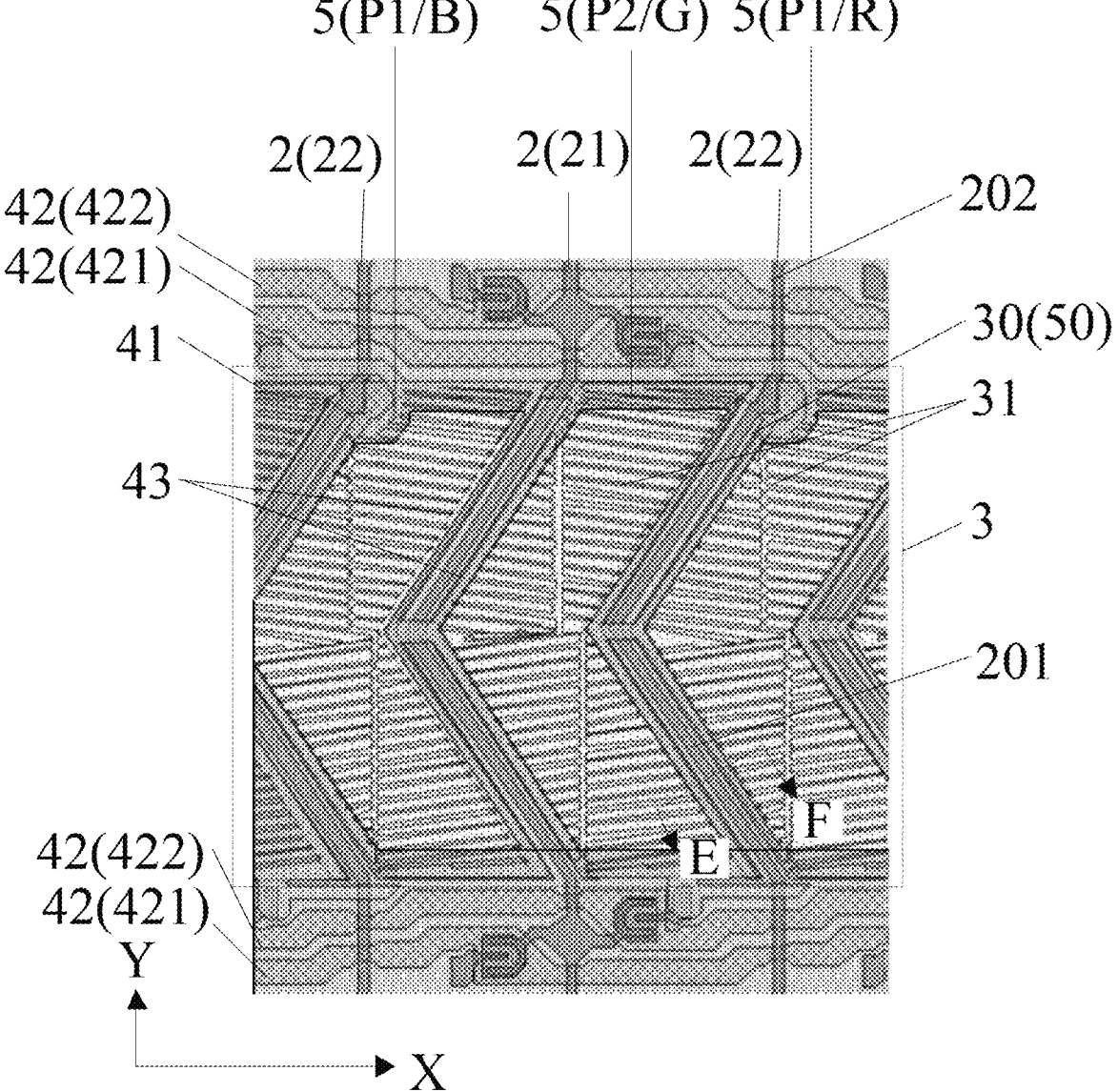
FIG. 12F is a schematic diagram of a black matrix formed on a display substrate, where a common electrode strip is merely provided with a first slit for a data line.
Figure 12G:
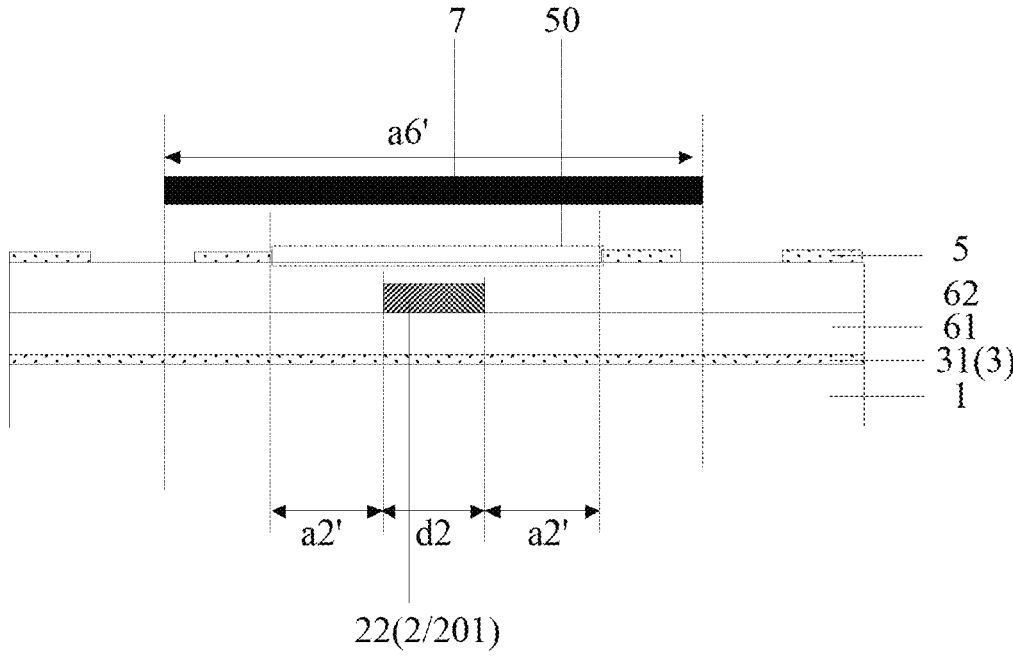
FIG. 12G is a schematic diagram of a section along a dotted line EF shown in FIG. 12F.

Specifically, as shown in FIGS. 6B and 12G, FIG. 6B shows a schematic diagram of a section at a data line 21, FIG. 12G shows a schematic diagram of a section at a first connection line 22. The first connection line 22 may have a line width d2 equal to a line width d1 of a data line 21 or less than the line width d1 of the data line 21. Moreover, a spacing a2' between the first connection line 22 and a second slit 50 may be equal to a spacing a2 between the data line 21 and the second slit 50 or less than the spacing a2 between the data line 21 and the second slit 50. In some embodiments, the first connection line 22 has the line width d2 less than the line width d1 of the data line 21, and/or the spacing a2' between the first connection line 22 and the second slit 50 is less than the spacing a2 between the data line 21 and the second slit 50, thereby further increasing an aperture ratio and transmittance. Specifically, the line width of the data line 21 may be 5.5 μm-9.5 μm, for example, 7.5 μm. The line width of the first connection line 22 may be 2 μm-8.5 μm, for example, 3 μm, 5 μm or 7.5 μm.

Specifically, the spacing a2' between the first connection line 22 and the second slit 50 may be 2.5 μm-5.5 μm, for example, 3 μm and 5 μm; and the distance a2 between the data line 21 and the second slit 50 may be 4.5 μm-5.5 μm, for example, 5 μm.

It is certain that a difference between the line width d1 of the data line 21 and the line width d2 of the first connection line 22 should not be too large, such that a whole pixel region may be displayed uniformly on the basis of improving the aperture ratio and transmittance, and occurrence of dark line or cross striation defects may be avoided. In some embodiments, the difference between the line width d1 of the data line 21 and the line width d2 of the first connection line 22 is less than 6 μm.

In some embodiments, the first black matrix sub-portion 7 with the orthographic projection on the base substrate 1 covering that of the first connection line 22 has a width less than or equal to a width of the first black matrix sub-portion 7 with the orthographic projection on the base substrate 1 covering that of the data line 21. Specifically, as shown in FIGS. 6B and 12G, a line width a6 of the first black matrix portion 7 corresponding to the data line 21 may be greater than or equal to the line width a6' of a first black matrix portion 7 corresponding to the first connection line 22. Specifically, for example, the line width a6 of the first black matrix portion 7 corresponding to the data line 21 may be 23 μm-25 μm, and the line width a6' of the first black matrix portion 7 corresponding to the first connection line 22 may be 17 μm-18.5 μm.

Specifically, as shown in FIG. 6B, in the embodiment of the disclosure, a first spacing a1 may be arranged between the data line 21 and the first slit 30 in a direction perpendicular to the extension direction of the first slit 30, so as to guarantee that the data line 21 is located in a region of the first slit 30 in case of process errors. Specifically, a size of the first spacing a1 may be determined according to manufacturing process accuracy of an actual process, for example, the first spacing a1 may be 3 μm-4 μm. In some embodiments, the first spacing a1 may be 3.5 μm.

Specifically, as shown in FIG. 6B, the shade strip 43 may have the width a3 of 4 μm-7 μm in the direction perpendicular to the extension direction of the first slit 30. Specifically, the shade strip 43 may have the width a3 of 4 μm, 5 μm, 6 μm or 7 μm. In some embodiments, the shade strip 43 may have the width a3 of 5 μm.

Specifically, as shown in FIG. 6B, there may be second spacing a2 between the data line 21 and the second slit 50 in the direction perpendicular to the extension direction of the first slit 30, specifically, the second spacing a2 may be 3 μm-7 μm. In some embodiments, the second spacing a2 may be 3 μm, 4 μm, 5 μm, 6 μm or 7 μm.

Specifically, as shown in FIG. 6B, a branch 5120 may have a width a4 of 2 μm-4 μm in a direction perpendicular to an extension direction of the branch 5120. Specifically, the branch 5120 may have the width a4 of 2.2 μm. A third slit 500 may have a width a5 of 4 μm-5 μm in the direction perpendicular to an extension direction of the branch 5120, specifically, the third slit 500 may have the width a5 of 4.4 μm.

Specifically, as shown in FIG. 6B, the first black matrix portion 7 may have the width a6 of 20 μm-28 μm in the direction perpendicular to the extension direction of the first slit 30, and specifically, the first black matrix portion 7 may have the width a6 of 20 μm, 21 μm, 22 μm, 23 μm, 24 μm, 25 μm, 26 μm, 27 μm or 28 μm. Specifically, the first black matrix portion 7 may have the width a6 of 24.5 μm.

A liquid crystal display (LCD) panel is widely used on account of a light and thin body, power saving and no radiation. According to a working principle of the LCD panel, an arrangement state of liquid crystal molecules in a liquid crystal layer is changed by changing a voltage difference between two ends of the liquid crystal layer, so as to change light transmittance of the liquid crystal layer and display an image. During specific implementation, the display panel according to the embodiment of the disclosure may be the liquid crystal display panel.

In order to more clearly understand the display panel structure according to the embodiment of the disclosure, process manufacturing flows of different display panel structures are described below.

Embodiment 1: for example, the display panel is in a dual gate structure, and may have a specific manufacturing flow as follows.

Step 1, a common electrode layer is formed at a side of a base substrate 1, as shown in FIG. 10A, where the common electrode layer includes a plurality of common electrode strips 3, the plurality of common electrode strips 3 extend in a first direction X and are arranged in a second direction Y, each common electrode strip 3 includes a plurality of common electrode blocks 31 arranged in sequence in the first direction X, and a first slit 30 is provided between adjacent common electrode blocks 31.

Step 2, a gate layer is formed on a side, facing away from the base substrate 1, of the common electrode layer, as shown in FIG. 10B, the gate layer includes a plurality of gate lines 42 extending in the second direction Y, the gate lines 42 may include a first gate line 421 and a second gate line 422, and orthographic projections of the first gate line 421 and the second gate line 422 on the base substrate 1 are located at a gap between orthographic projection of two adjacent rows of pixel electrodes 5 on the base substrate 1; the gate layer further includes a plurality of second connection lines 41 extending in the first direction X, and common electrode blocks 31 of the same common electrode strip 3 are electrically connected with the same second connection line 41; and the gate layer further includes a shade strip 43 mainly extending in the second direction Y, and an orthographic projection of the shade strip 43 on the base substrate 1 covers a region of the common electrode block 31 close to the first slit 30.

Step 3, an active layer 8 is formed on a side of the gate layer facing away from the common electrode layer, as shown in FIG. 10C.

Step 4, a data line layer is formed on a side of the active layer 8 facing away from the gate layer, as shown in FIG. 10D, the data line layer includes a plurality of data lines 21 and first connection lines 22 with bodies extending in the second direction Y, and the data lines 21 and the first connection lines 22 are alternately arranged in the first direction X.

Step 5, a pixel electrode layer is formed on a side of the data line layer facing away from the active layer, as shown in FIG. 10E, the pixel electrode layer includes a plurality of pixel electrodes 5, each pixel electrode 5 includes two sub-pixel electrode portions 51 arranged in the first direction X, and a bridge portion 53 connecting the two sub-pixel electrode portions 51, and a second slit 50 is provided between the two sub-pixel electrode portions 51.

Step 6, a second insulation layer 62 is formed on a side of the pixel electrode layer facing away from the data layer, as shown in FIG. 6B.

Step 7: an opposite substrate is formed on a side of the second insulation layer 62 facing away from the pixel electrode layer, where the opposite substrate includes a black matrix, as shown in FIGS. 10F and 10G. FIG. 10G is a schematic diagram of a single film layer of the black matrix, the black matrix includes a first black matrix portion 7 arranged corresponding to a region of the first slit 30, and an orthographic projection of the first black matrix portion 7 on the base substrate 1 covers an orthographic projection of the first slit 30 on the base substrate 1.

Embodiment 2: for example, a display panel in a single-gate structure is taken as an example, and may have a specific manufacturing flow as follows.

Figure 11A:
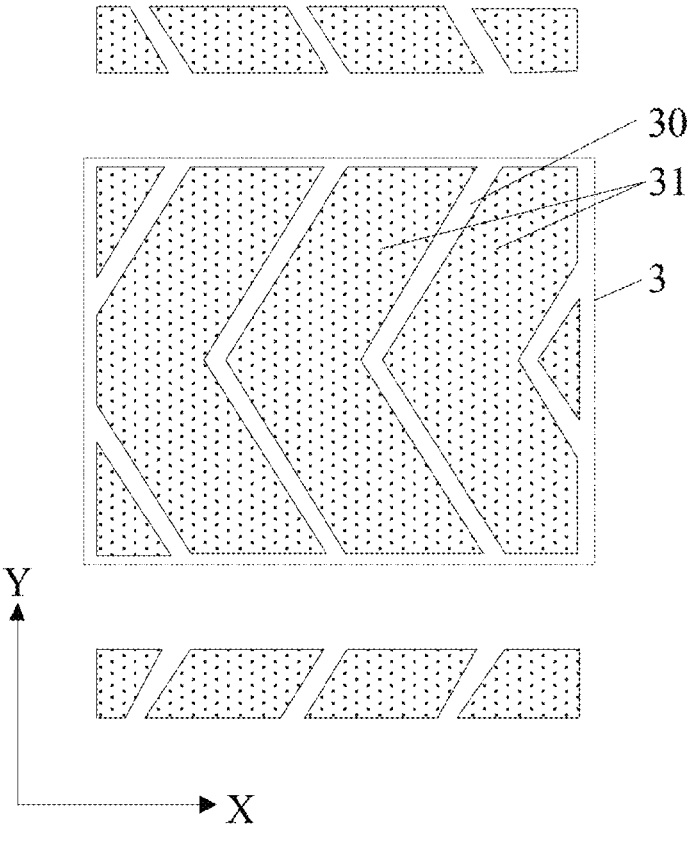
FIG. 11A is a schematic diagram of a common electrode layer formed on a display substrate in a single-gate structure.

Step 1, a common electrode layer is formed on a side of a base substrate 1, as shown in FIG. 11A, where the common electrode layer includes a plurality of common electrode strips 3, the plurality of common electrode strips 3 extend in a first direction X and are arranged in a second direction Y, each common electrode strip 3 includes a plurality of common electrode blocks 31 arranged in sequence in the first direction X, and a first slit 30 is provided between adjacent common electrode blocks 31.

Figure 11B:
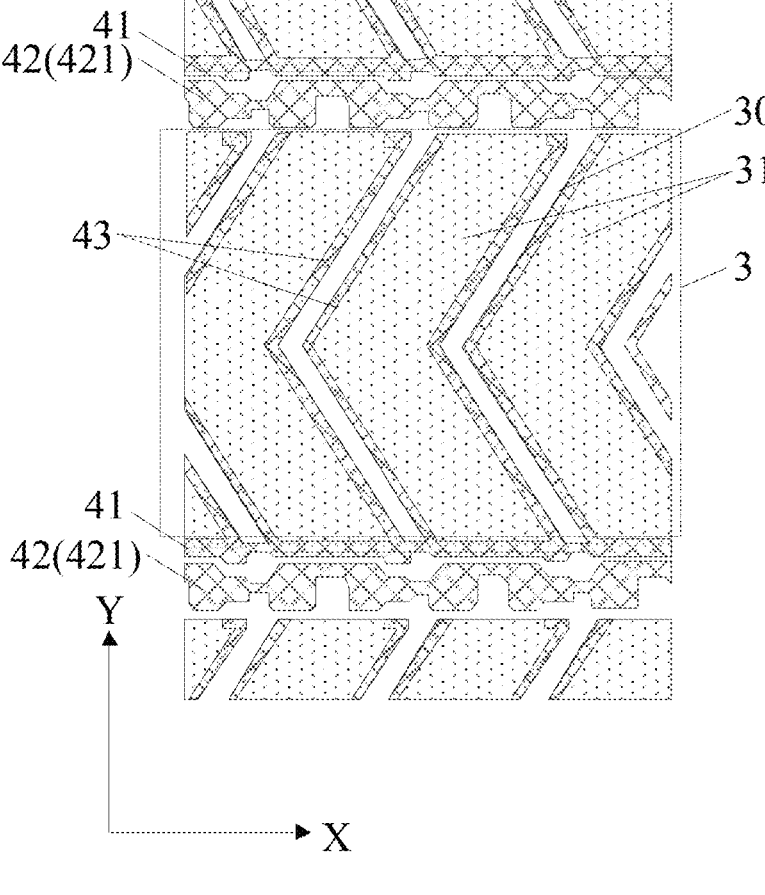
FIG. 11B is a schematic diagram of a gate layer formed on a display substrate in a single-gate structure.

Step 2, a gate layer is formed on a side of the common electrode layer facing away from the base substrate 1, as shown in FIG. 11B, the gate layer includes a plurality of gate lines 42 extending in the second direction Y; the gate layer further includes a plurality of second connection lines 41 extending in the first direction X, and common electrode blocks 31 of the same common electrode strip 3 are electrically connected with the same second connection line 41, specifically, the second connection line 41 may be located below the connected common electrode strip 3; and the gate layer further includes a shade strip 43 with a body extending in the second direction Y, and an orthographic projection of the shade strip 43 on the base substrate 1 covers a region of the common electrode block 31 close to the first slit 30.

Figure 11C:
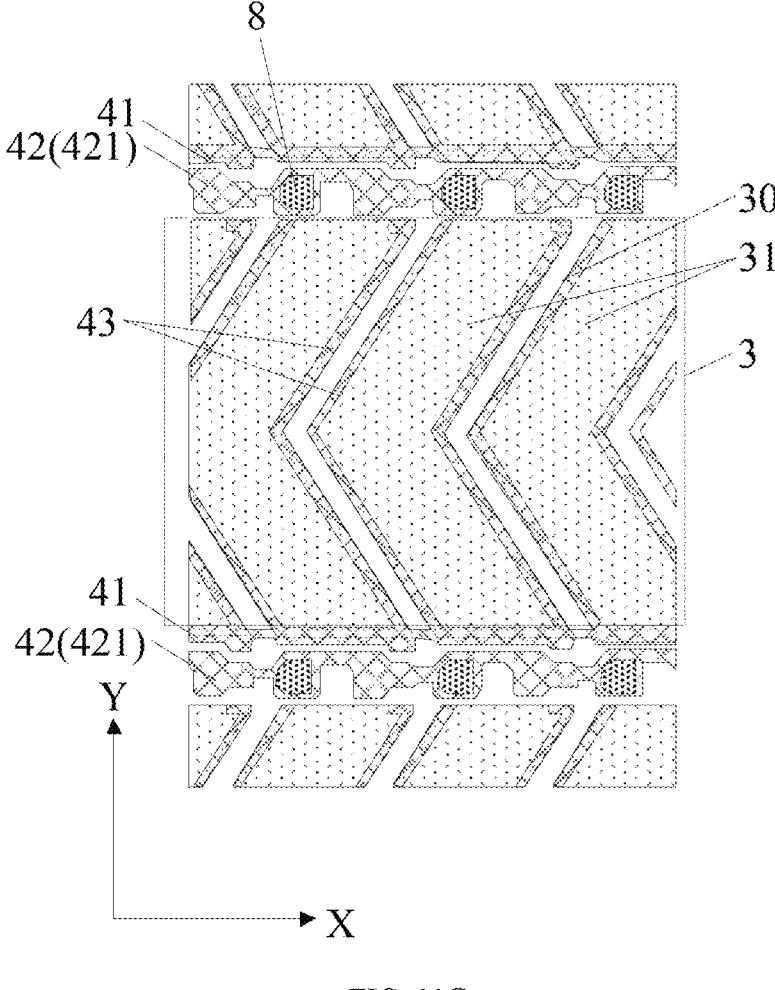
FIG. 11C is a schematic diagram of an active layer formed on a display substrate in a single-gate structure.

Step 3, an active layer 8 is formed on a side of the gate layer facing away from the common electrode layer, as shown in FIG. 11C.

Figure 11D:
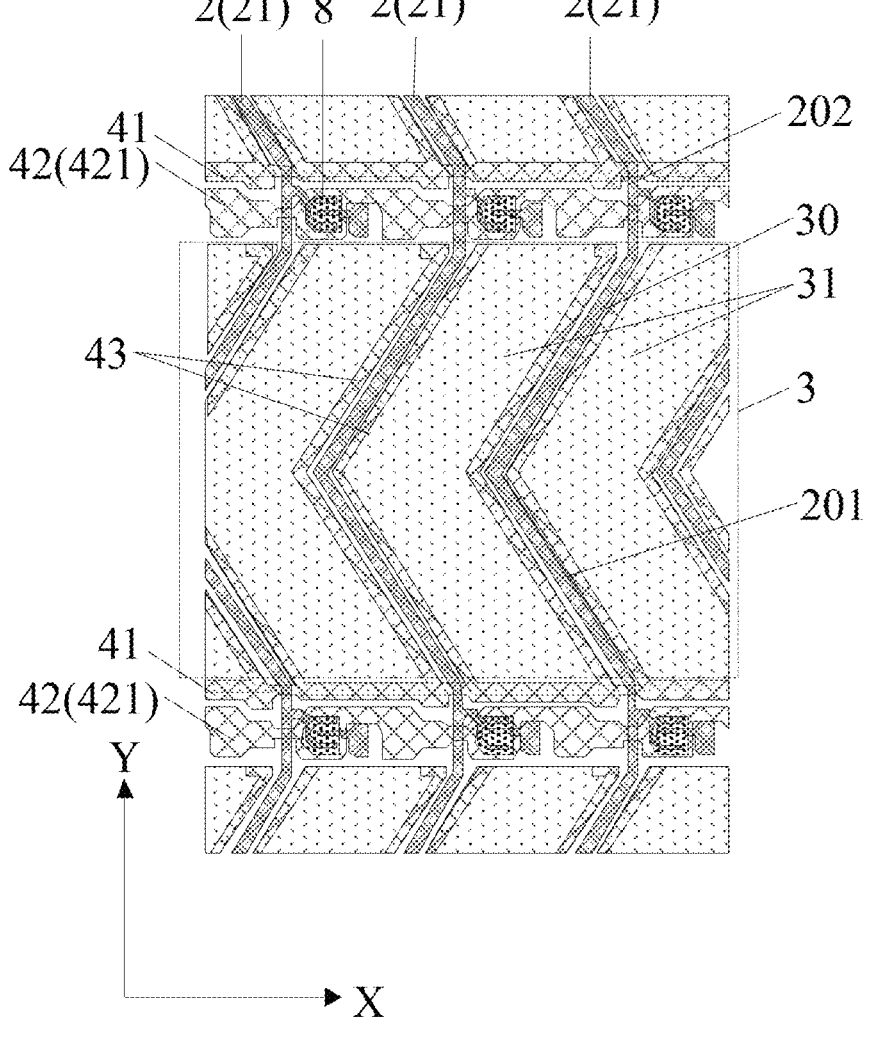
FIG. 11D is a schematic diagram of a common electrode layer formed on a display substrate in a single-gate structure.

Step 4, a data line layer is formed on a side of the active layer 8 facing away from the gate layer, as shown in FIG. 11D, and the data line layer includes a plurality of data lines 21 with bodies extending in the second direction Y.

Figure 11E:
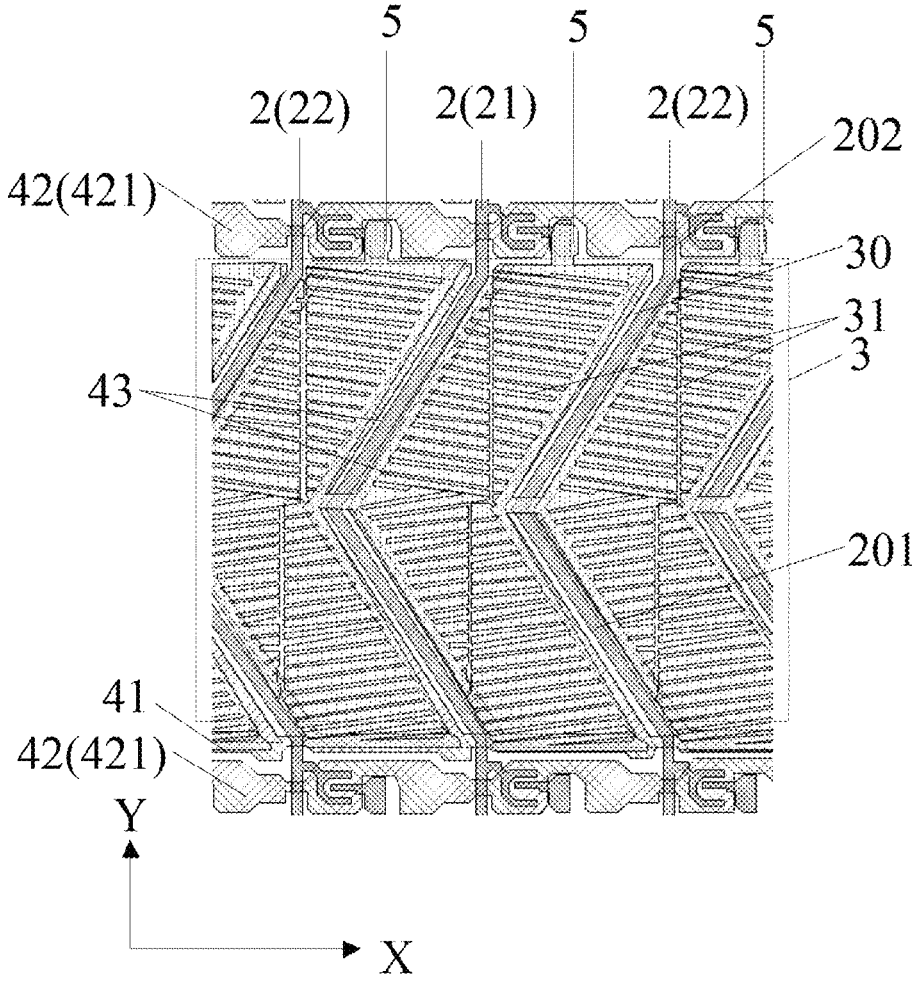
FIG. 11E is a schematic diagram of a pixel electrode layer formed on a display substrate in a single-gate structure.

Step 5, a pixel electrode layer is formed on a side of the data line layer facing away from the active layer, as shown in FIG. 11E, the pixel electrode layer includes a plurality of pixel electrodes 5, each pixel electrode 5 includes two sub-pixel electrode portions 51 arranged in the first direction X, and a bridge portion 53 connecting the two sub-pixel electrode portions 51, and a second slit 50 is provided between the two sub-pixel electrode portions 51.

Step 6, a second insulation layer 62 is formed on a side of the pixel electrode layer facing away from the data layer, as shown in FIG. 6B.

Figure 11F:
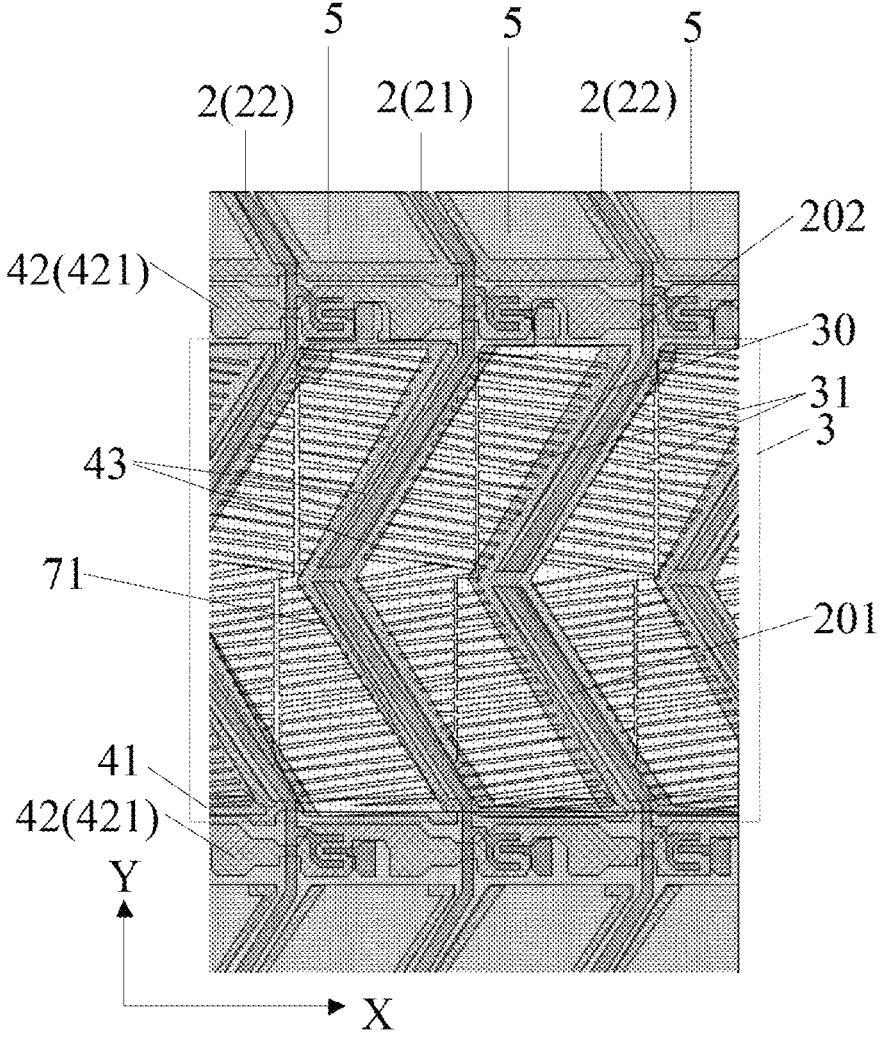
FIG. 11F is a schematic diagram of a black matrix formed on a display substrate in a single-gate structure.
Figure 11G:
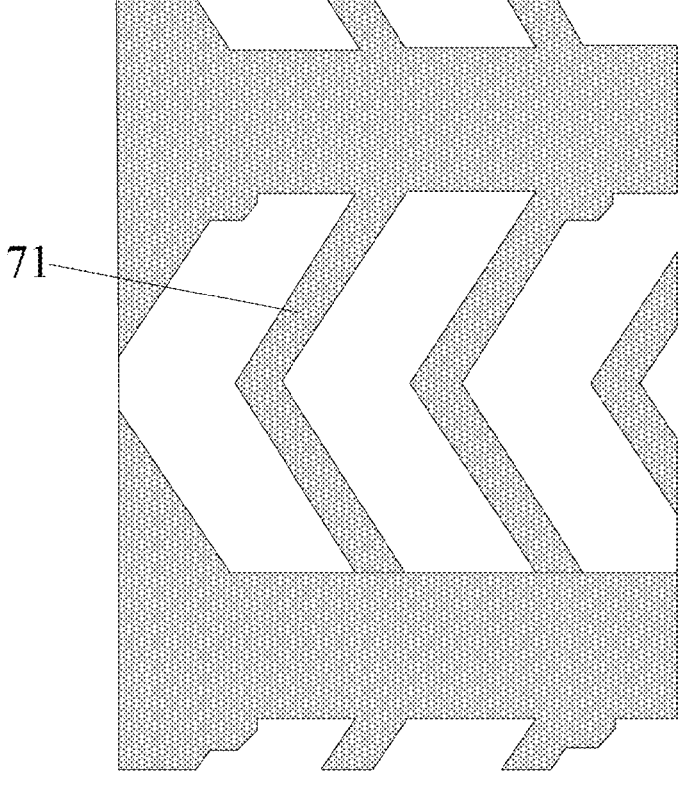
FIG. 11G is a schematic diagram of a single film layer of a black matrix.

Step 7: an opposite substrate is formed on a side of the second insulation layer 62 facing away from the pixel electrode layer, where the opposite substrate includes a black matrix, as shown in FIGS. 11F and 11G. FIG. 11G is a schematic diagram of a single film layer of the black matrix, the black matrix includes a first black matrix portion 7 arranged corresponding to a region of the first slit 30, and an orthographic projection of the first black matrix portion 7 on the base substrate 1 covers an orthographic projection of the first slit 30 on the base substrate 1.

Embodiment 3: for example, a display panel merely being provided with a first slit 30 at a position of a data line 21 is taken as example, and may have a specific manufacturing flow as follows.

Step 1, a common electrode layer is formed on a side of a base substrate 1, as shown in FIG. 12A, where the common electrode layer includes a plurality of common electrode strips 3, the plurality of common electrode strips 3 extend in a first direction X and are arranged in a second direction Y, each common electrode strip 3 includes a plurality of common electrode blocks 31 arranged in sequence in the first direction X, and a first slit 30 is provided between adjacent common electrode blocks 31; and the common electrode block 31 is merely provided with the first slit 30 at the position of the data line 21.

Step 2, a gate layer is formed on a side of the common electrode layer facing away from the base substrate 1, as shown in FIG. 12B, the gate layer includes a plurality of gate lines 42 extending in the second direction Y, the gate lines 42 may include a first gate line 421 and a second gate line 422, and orthographic projections of the first gate line 421 and the second gate line 422 on the base substrate 1 are located in a gap between orthographic projection of two adjacent rows of pixel electrodes 5 on the base substrate 1; the gate layer further includes a plurality of second connection lines 41 extending in the first direction X, and common electrode blocks 31 of the same common electrode strip 3 are electrically connected with the same second connection line 41; and the gate layer further includes a shade strip 43 with a body extending in the second direction Y, and an orthographic projection of the shade strip 43 on the base substrate 1 covers a region of the common electrode block 31 close to the first slit 30.

Step 3, an active layer 8 is formed on a side of the gate layer facing away from the common electrode layer, as shown in FIG. 12C.

Step 4, a data line layer is formed on a side of the active layer 8 facing away from the gate layer, as shown in FIG. 12D, the data line layer includes a plurality of data lines 21 and first connection lines 22 with bodies extending in the second direction Y, and the data lines 21 and the first connection lines 22 are alternately arranged in the first direction X.

Step 5, a pixel electrode layer is formed on a side of the data line layer facing away from the active layer, as shown in FIG. 12E, the pixel electrode layer includes a plurality of pixel electrodes 5, each pixel electrode 5 includes two sub-pixel electrode portions 51 arranged in the first direction X, and a bridge portion 53 connecting the two sub-pixel electrode portions 51, and a second slit 50 is provided between the two sub-pixel electrode portions 51.

Step 6, a second insulation layer 62 is formed on a side of the pixel electrode layer facing away from the data layer, as shown in FIG. 6B.

Figure 12H:
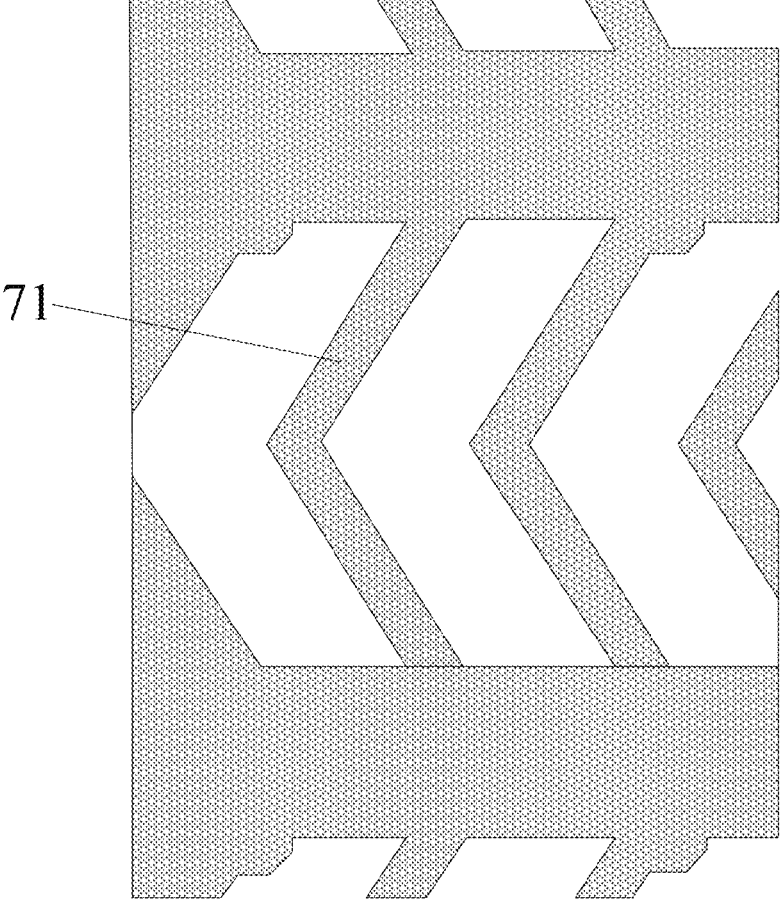
FIG. 12H is a schematic diagram of a single film layer of a black matrix.

Step 7: an opposite substrate is formed on a side of the second insulation layer 62 facing away from the pixel electrode layer, where the opposite substrate includes a black matrix, as shown in FIGS. 12F and 12G, FIG. 12H is a schematic diagram of a single film layer of the black matrix, the black matrix includes a first black matrix portion 7 arranged corresponding to a region of the first slit 30, and an orthographic projection of the first black matrix portion 7 on the base substrate 1 covers an orthographic projection of the first slit 30 on the base substrate 1.

Based on the same inventive concept, the embodiment of the disclosure provides a display apparatus including the display panel according to the embodiment of the disclosure.

In the embodiment of the disclosure, the common electrode strip 3 includes the plurality of common electrode blocks 31 arranged in sequence in the first direction X, the first slit 30 is provided between adjacent common electrode blocks 31, and the orthographic projection of the signal lines 2 on the base substrate 1 is located within the orthographic projection of the first slit 30 on the base substrate 1. By designing the common electrode strip 3 in blocks, the common electrode blocks 31 are arranged with the bent signal line 2 as a boundary, so as to avoid a large-area vertical overlap between the common electrode strip 3 and the signal line 2, and reduce coupling capacitance between the common electrode strip 3 and the signal line 2. Moreover, compared with the related art in which coupling capacitance between a common electrode strip 3 and a signal line 2 is reduced by arranging a thick organic film, according to the embodiment of the disclosure, applicability to a large-size display product and low manufacturing cost are achieved, and mass production and application of 3D display products may be facilitated.

The display apparatus according to the embodiment of the disclosure is any product or component with a display function, such as a mobile phone, a tablet computer, a television, a display, a notebook computer, a digital photo frame and a navigator. Other essential components of the display shall be understood as necessary by those of ordinary skill in the art, are not described herein in detail, and should not be regarded as limitation to the disclosure.

Although preferred embodiments of the disclosure have been described, a person of ordinary skill in the art can make additional changes and modifications to these embodiments once learning the basic inventive concept. Therefore, the appended claims are intended to be constructed as encompassing the preferred embodiments and all modifications and changes falling within the scope of the disclosure.

Apparently, a person of ordinary skill in the art can make various modifications and variations to the embodiments of the disclosure without departing from the spirit and scope of the embodiments of the disclosure. In this way, if these modifications and variations of the embodiments of the disclosure fall within the scope of the claims of the disclosure and their equivalent technologies, the disclosure is also intended to encompass these modifications and variations.

What is claimed is:

1. A display substrate, comprising:
a base substrate;
a plurality of signal lines, wherein the plurality of signal lines are disposed at a side of the base substrate and are arranged in a first direction, and an orthographic projection of each signal line on the base substrate is in a shape of a bent line; and
a plurality of common electrode strips;
wherein
    the plurality of common electrode strips and the plurality of signal lines are disposed at the same side of the base substrate and are insulated from each other;
    the plurality of common electrode strips extend in the first direction and are arranged in a second direction;
    each common electrode strip comprises a plurality of common electrode blocks arranged in sequence in the first direction, and a first slit is provided between adjacent common electrode blocks; and
    orthographic projections of at least part of the signal lines on the base substrate are located within orthographic projections of the first slits on the base substrate.

2. The display substrate according to claim 1, wherein the signal line comprises a first signal line portion and a second signal line portion;
an orthographic projection of the first signal line portion on the base substrate is located within a region of the orthographic projection of the first slit on the base substrate;
an orthographic projection of the second signal line portion on the base substrate is located in a gap between two adjacent common electrode strips;
the orthographic projection of the first signal line portion on the base substrate is in a shape of a bent line; and the orthographic projection of the first slit on the base substrate and the orthographic projection of the first signal line portion on the base substrate are similar in shape.

3. The display substrate according to claim 2, wherein the first slit has a width greater than a width of the first signal line portion in a direction perpendicular to an extension direction of the first signal line portion.

4. The display substrate according to claim 1, further comprising:
a data line layer on a side of the common electrode strip facing away from the base substrate;
wherein
the data line layer comprises a plurality of data lines extending in the second direction; and
the plurality of signal lines comprise the plurality of data lines;
wherein
the data line layer further comprises a plurality of first connection lines extending in the second direction, and the two adjacent common electrode strips are electrically connected with each other through the first connection line; and
the plurality of signal lines comprise the first plurality of connection lines.

5. The display substrate according to claim 4, wherein the common electrode strip is provided with the first slit only in a region corresponding to the data line; or
the common electrode strip is provided with the first slits in a region corresponding to the data line and a region corresponding to the first connection line.

6. The display substrate according to claim 4, wherein the data lines and the first connection lines are alternately arranged in the first direction.

7. The display substrate according to claim 4, further comprising:
a plurality of second connection lines extending in the first direction, wherein the common electrode blocks of the same common electrode strip are electrically connected with the same second connection line.

8. The display substrate according to claim 7, further comprising:
a gate layer between a common electrode layer and the data line layer;
wherein
the gate layer comprises a plurality of gate lines extending in the second direction; and
the second connection lines are disposed in the gate layer.

9. The display substrate according to claim 8, further comprising:
a shade strip disposed on a side of the common electrode strip facing away from the base substrate;
wherein an orthographic projection of the shade strip on the base substrate covers a region of the common electrode block close to the first slit.

10. The display substrate according to claim 9, at least one of the following is comprised:
wherein the orthographic projection of the shade strip on the base substrate and the orthographic projection of the first slit on the base substrate do not overlap each other;
or
wherein the orthographic projection of the shade strip on the base substrate and the orthographic projection of the first slit on the base substrate are similar in shape.

11. The display substrate according to claim 10, wherein in the second direction, the shade strip has a length approximately same as a length of the first signal line portion.

12. The display substrate according to claim 9, wherein the shade strip is disposed in the gate layer.

13. The display substrate according to claim 4, further comprising:

a plurality of pixel electrodes disposed on a side of the data line layer facing away from the base substrate; wherein the pixel electrode comprises two sub-pixel electrode portions arranged in the first direction and a bridge portion connecting the two sub-pixel electrode portions, and a second slit is provided between the two sub-pixel electrode portions.

14. The display substrate according to claim 13, wherein the orthographic projection of the signal line on the base substrate is located within an orthographic projection of the second slit on the base substrate;

wherein the orthographic projection of the first slit on the base substrate is located within the orthographic projection of the second slit on the base substrate.

15. The display substrate according to claim 14, wherein the sub-pixel electrode portion comprises a skeleton portion and a plurality of branch groups;

the skeleton portion is in a shape of a bent line with a body extending in the second direction; and the plurality of branch groups extend from the skeleton portion to a side facing away from the second slit.

16. The display substrate according to claim 15, wherein the plurality of branch groups comprise first branch groups and second branch groups;

in the plurality of branch groups connected with a same skeleton portion, the first branch groups and the second branch groups are alternately arranged, and an outer edge of the first branch group protrudes relative to an outer edge of the second branch group.

17. The display substrate according to claim 15, wherein first branch groups of different sub-pixel electrode portions in a same pixel electrode are staggered in a direction parallel to an extension direction of the first branch groups; and second branch groups of different sub-pixel electrode portions in the same pixel electrode are staggered in the direction parallel to an extension direction of the first branch groups.

18. The display substrate according to claim 15, wherein the branch group comprises: a plurality of branches extending from the skeleton portion to a side facing away from the second slit, and a third slit is provided between adjacent branches in a same branch group; and outer edges of the plurality of branches in the same branch group facing away from the second slit, are approximately flush.

19. The display substrate according to claim 17, wherein patterns of outer edge of branch groups of the adjacent pixel electrodes are complementary to each other;

wherein the first branch group of the pixel electrode faces a second branch group of an adjacent pixel electrode adjacent to the pixel electrode.

20. The display substrate according to claim 13, wherein the first connection line has a line width less than or equal to a line width of the data line; and a spacing between the first connection line and the second slit is less than or equal to a spacing between the data line and the second slit.

21. The display substrate according to claim 13, wherein the data line layer further comprises a first electrode electrically connected with the data line and a second electrode separated from the first electrode;

the pixel electrode comprises a first type of pixel electrode and a second type of pixel electrode alternately arranged in the first direction; wherein the first type of pixel electrode comprises a first adaptation portion and a first connection portion, the first connection portion crosses the first connection line to connect the first adaptation portion with one sub-pixel electrode portion in the first type of pixel electrode, and an orthographic projection of the first adaptation portion on the base substrate and an orthographic projection of the second electrode on the base substrate have an overlapped region; and the second type of pixel electrode comprises a second adaptation portion directly connected with one sub-pixel electrode portion in the second type of pixel electrode, and an orthographic projection of the second adaptation portion on the base substrate and the orthographic projection of the second electrode on the base substrate have an overlapped region, wherein the second type of pixel electrode further comprises: a compensation portion extending from a side of the second adaptation portion in the first direction facing away from the data line; and an orthographic projection of the compensation portion on the base substrate overlaps an orthographic projection of the first connection line on the base substrate.

22. The display substrate according to claim 21, wherein an overlapped area formed by the orthographic projection of the compensation portion on the base substrate and the orthographic projection of the first connection line on the base substrate is approximately same as an overlapped area formed by an orthographic projection of the first connection portion on the base substrate and the orthographic projection of the first connection line on the base substrate.

23. A display panel, comprising the display substrate according to claim 1.

24. The display panel according to claim 23, further comprising an opposite substrate arranged opposite to the display substrate, wherein the opposite substrate comprises a black matrix; wherein the black matrix comprises a first black matrix portion arranged corresponding to a first slit region; and an orthographic projection of the first black matrix portion on a base substrate covers an orthographic projection of a first slit on the base substrate.

* * * * *